United States Patent [19]

Hudgens et al.

[11] Patent Number: 4,737,379

[45] Date of Patent: Apr. 12, 1988

[54] PLASMA DEPOSITED COATINGS, AND LOW TEMPERATURE PLASMA METHOD OF MAKING SAME

[75] Inventors: Stephen J. Hudgens, Southfield; Annette G. Johncock, Royal Oak; Stanford R. Ovshinsky, Bloomfield Hills; Prem Nath, Rochester, all of Mich.

[73] Assignee: Energy Conversion Devices, Inc., Troy, Mich.

[21] Appl. No.: 32,263

[22] Filed: Mar. 31, 1987

Related U.S. Application Data

[63] Continuation-in-part of Ser. No. 8,442, Jan. 29, 1987, and a continuation-in-part of Ser. No. 896,049, Aug. 13, 1986, Pat. No. 4,701,343, and a continuation-in-part of Ser. No. 854,247, Apr. 21, 1986, Pat. No. 4,664,937, which is a continuation-in-part of Ser. No. 8,442, Jan. 29, 1987, which is a continuation-in-part of Ser. No. 896,049, Aug. 13, 1986, which is a continuation-in-part of Ser. No. 854,247, Apr. 21, 1986, and a continuation of Ser. No. 725,616, Apr. 25, 1985, Pat. No. 4,615,905, and a continuation of Ser. No. 423,424, Sep. 24, 1982, Pat. No. 4,517,223, and a continuation-in-part of Ser. No. 605,575, Apr. 30, 1984, Pat. No. 4,504,518, and a continuation-in-part of Ser. No. 423,424, Sep. 24, 1982, Pat. No. 4,517,223.

[51] Int. Cl.$^4$ .............................................. B05D 3/06
[52] U.S. Cl. ....................................... 427/39; 437/234
[58] Field of Search .................... 427/39, 38; 437/234

[56] References Cited

U.S. PATENT DOCUMENTS

| | | | |
|---|---|---|---|
| 4,340,617 | 7/1982 | Deutsch et al. | 427/53.1 |
| 4,657,777 | 4/1987 | Hirooka et al. | 427/39 |
| 4,689,093 | 8/1987 | Ishihara et al. | 427/39 |

Primary Examiner—John H. Newsome
Attorney, Agent, or Firm—Richard M. Goldman; Marvin S. Siskind

[57] ABSTRACT

A method of depositing a substantially hydrogen free or controlled hydrogen content multi-element alloy film on a substrate. The method utilizes a microwave excited plasma of a hydrogen free precursor gas to deposit a hard, adherent coating. The method comprises providing a substrate to be coated in a vacuum deposition chamber, with a source of microwave energy coupled to the vacuum deposition chamber. A substantially hydrogen free reaction gas precursor composition is introduced into the reaction chamber at a pressure corresponding substantially to a pressure minimum of the modified Paschen curve for the reaction gas precursor composition. Activation of the source of microwave energy excites the reaction gas precursor composition, in this way forming a plasma in the vacuum deposition chamber to deposit a substantially hydrogen free or controlled hydrogen content multi-element alloy film on the substrate.

78 Claims, 6 Drawing Sheets

PLASMA DEPOSITED COATINGS, AND LOW TEMPERATURE PLASMA METHOD OF MAKING SAME

CROSS REFERENCE TO RELATED APPLICATION

This is a continuation in part of our commonly assigned, copending U.S. application Ser. No. 008442, filed Jan. 29, 1987 for Method of Fabricating Electrostatic Drums Using Microwave Energy, U.S. application Ser. No. 896,049 filed Aug. 13, 1986 for Method of Depositing Thin Films Using Microwave Energy, now U.S. Pat. No. 4,701,343 and U.S. application Ser. No. 854,247 filed Apr. 21, 1986 for A Method of Depositing Semiconductor Films By Free Radical Generation, now U.S. Pat. No. 4,664,937 of which said U.S. application Ser. No. 008442 is a continuation-in-part, said U.S. applications Ser. Nos. 896,049 and 854,247 being continuations of U.S. application Ser. No. 725,616 filed Apr. 25, 1985, now U.S. Pat. No. 4,615,905 issued Oct. 7, 1985 for Method of Depositing Semiconductor Films By Free Radical Generation, said U.S. application Ser. No. 725,616 (now U.S. Pat. No. 4,615,905) being a continuation of U.S. application Ser. No. 434,424 filed Sept. 24, 1982, now U.S. Pat. No. 4,517,223 issued May 14, 1985 for Method of Making Amorphous Semiconductor Alloys and Devices Using Microwave Energy, and a continuation in part of U.S. application Ser. No. 605,575, filed now U.S. Pat. No. 4,504,518 issued Mar. 12, 1985 for Method of Making Amorphous Semiconductor Alloys And Devices Using Microwave Energy, said U.S. application Ser. No. 605,575 being a continuation in part of U.S. application Ser. No. 434, 424, now U.S. Pat. No. 4,517,223.

FIELD OF THE INVENTION

This invention relates to glow discharge methods of fabricating alloy films or coatings either substantially hydrogen free or of controlled hydrogen content, and to the alloys films or coatings prepared thereby. The alloys, substantially hydrogen free or of controlled hydrogen content, which can have the characteristics of ceramics, dielectrics, and semiconductors, find general utility e.g., as hard coatings, and as passivation structures. Thus, in a preferred exemplification, this invention relates to methods of depositing hard coatings exemplified by tool coatings, and optically transmissive hard coatings, to the hard coatings prepared thereby, and to articles formed of a material subject to abrasion or other degradation, with hard coatings, as optically transmissive hard coatings, thereon. The invention more particularly relates to methods of depositing such coatings at relatively low temperatures by plasma deposition from feedstock gases free of chemically bonded hydrogen and hydrides, where the plasmas are electrically excited, for example, by microwave energy.

BACKGROUND OF THE INVENTION

A considerable effort has been made to develop processes for rapidly and readily depositing amorphous or substantially amorphous alloys or films, each of which can encompass relatively large areas, if desired, limited only by the size of the deposition equipment. This work was originally concentrated in the field of amorphous silicon alloys. Thin films may be deposited by plasma enhanced chemical vapor deposition. In plasma enhanced chemical vapor deposition, also referred to as glow discharge deposition, a hydrogen containing feed stock gas, such as a hydride or polyhydride, is decomposed in the plasma by electron collisions to form unstable precursor species, i.e., molecular fragments, principally hydrogen containing free radicals. These unstable precursor species, as ions, or free radicals, diffuse to the substrate surface and deposit thereupon as a film through surface reactions involving partial hydrogen elimination.

In the prior art processes, the substrate temperature is the greatest single determinant of the hydrogen content of the deposited film. This is because the hydrogen elimination reaction is strongly dependent on the substrate temperature, and is more efficient at high substrate temperatures. In turn, the deposited film's optical, electrical, and mechanical properties are known to be strongly dependent on the hydrogen content and bonding type. For example, amorphous silicon deposited by conventional plasma assisted chemical vapor deposition from silane feedstock onto a cold substrate has a high hydrogen content, many $(Si-H_2)_n$ bonds, poor abrasion resistance, poor corrosion resistance, and poor semiconductor properties.

Fluorinated feedstock gases have also been used with the glow discharge process to deposit thin films on substrates. Fluorine is a highly reactive element which forms species in the plasma principally fluorine free radicals, which are capable of etching the substrate and the deposited film and can thus prevent the film from forming unless controlled. When fluorinated feedstock gases are used with hydrides or polyhydrides, hydrogen acts as a carrier to combine with excess fluorine to form, for example, HF and thereafter remove some of the fluorine from the plasma. Provided the proportions are properly chosen, this fluorine removal process causes a reduction in the etching process otherwise produced by the fluorine, which balances the deposition kinetics in favor of film growth to allow the deposition to take place. In the process, however, both hydrogen and fluorine are inevitably incorporated in the film. This may be desirable for attaining certain properties in the film, such as those related to semiconductor action, but the heretofore unavoidable incorporation of hydrogen and fluorine in such films, particularly at low substrate temperatures, results the production of films which exhibit other properties totally unacceptable for the intended purpose.

Because of the uncontrolled incorporation of hydrogen and in some cases fluorine in films formed using the glow discharge process, it has not been possible to use this process to make certain alloy films which can be deposited using other processes, such as sputtering or evaporation. Because such other processes, e.g., sputtering, are not economical for large scale manufacturing purposes, due to fundamental limitations on deposition rate, many known films, while having highly desirable properties such as hardness and transparency, have not enjoyed widespread commercial use.

While some hydrogen free films have been deposited by some workers in the field using glow discharge techniques, because of an incomplete understanding of the separate roles played by plasma species, e.g. gassifier, scavenger, etc. exotic plasma conditioning for instance, electron cyclotron resource excited microwave plasmas, or high substrate temperatures were required to achieve the desired film deposition. For example, U.S. Pat. No. 4,481,229 to Suzuki et al discloses the formation of a hydrogen free Si-N film using a microwave glow discharge process occurring in magnetic field of intensity B such as to result in near electron cyclotron resonance conditions at the frequency of the applied microwave radiation. Practical deposition systems utilizing this art therefore will require the creation and control of a uniform large magnetic field throughout the plasma volume. Additionally such a system will require the use of microwave tuning and applicator technology capable of coupling microwave energy into a plasma impedance which is changing rapidly near the resource condition. The additional technological complications brought about by these requirements have significant economic consequences for manufacturing machines employing this art.

In other examples, including (but not limited to) M. Janai, et al "Chemical Vapor Deposition of Amorphous Silicon Prepared from $SiF_2$ Gas, " *J. Appl. Phys.* 52 (5), pp 3622-3623; M. Janai, et al "Properties of Fluorinated Glow-Discharge Amorphous Silicon," *Phys. Rev. B*, 31 (8), pp 5311-5321; M. Janai, et al "Optical Absorption And Photoluminescense of Glow Discharge Amorphous Si:F Films,: *Phys Rev. B*, 31 (10) pp 6609-6615; K. Kuppers, et al "Deposition of Fluorine Deoped Silicon Layers From A $SiCl_4/SiF_y/O_2$ Gas Mixture By The Plasma CVD Method," *J. Electrochem. Soc: Solid State Science and Technology*, Aug. 1978 pp 1298-1302; D. R. Secrist, et al "Glow Discharge Syntheon of A Fluorosiloxane Polymer", *Polymer Letters*, 4, pp 537-540. S. Fujita, et al "Electrical Properties of Silicon Nitride Films Plasma Deposited From $SiF_4$, $N_2$, and $H_2$ Source Gases," *J. Appl. Phys.*, 57(2), pp 426-431; Fujita, et al "Plasma Enhanced Chemical Vapor Deposition of Fluorinated Silicon Nitride," *Jap. J. Appl. Phys.* 23(3), pp L144-146, and Fujita, et al "Plasma Deposited Silicon Nitride," *Jap. J. Appl. Phys., L268-L280.*, disclose the use of halogenated feedstock gases with or in some cases, without hydrogen to deposit nominally hydrogen free films by plasma glow discharge decomposition. In all cases these researchers utilize elevated substrate temperatures to control hydrogen and halogen content.

Many techniques of exciting conventional glow discharge plasmas have been investigated. These have included direct current (DC) and alternating current (AC) techniques. Various AC frequencies have been utilized, such as audio, radio frequency (RF), and a microwave frequency of 2.56 GHz. The present inventors have shown, in U.S. application Ser. No. 605,575, now U.S. Pat. No. 4,504,518 that the optimum deposition power and pressure are defined by the minimum of the Paschen curve. The Paschen curve defined the voltage (V) needed to sustain the glow discharge plasma at each pressure (P) in a range of pressures, between electrodes separated by a distance (D). In a typically configured, conventional RF glow discharge system, the minimum in the Paschen curve occurs at a few hundred Torr.

It has previously been discovered that increasing the applied RF power increases the gas utilization efficiency and the deposition rate. However, simply increasing the RF power to achieve deposition rates approximately greater than 10 Angstroms/sec. leads to the production of hydrogen containing alloy films of decreasing hardness, abrasion resistance, and electronic quality, and can result in films which include polymeric material and/or the production of powder. The increased deposition rate with increased RF power is a result of an increase in the concentration of excited species resulting principally from collisions between electrons and feedstock molecules. However, the collision rate between excited species and more importantly between excited species and feedstock molecules is also increased. This results in the formation of gas phase polymer chains. These chains are either incorporated in the growing alloy film degrading its physical and/or electronic quality, or condensed in the gas phase to produce powder particles. To reduce the number of undesirable collisions one can reduce the operating pressure, but this moves the deposition process off the minimum of the Paschen curve and substantially higher RF power is required to achieve the same degree of plasma excitation. The physical reason for this phenomenon is that, as pressure is reduced, many electrons that would have been able to collisionally excite feedstock molecules at higher gas pressures now impinge on the substrate or system walls without suffering collisions. The much higher applied RF power required to sustain the plasma at these reduced pressures has the undesirable consequence of raising the substrate self-bias with respect to the plasma, thus producing greatly increased ion bombardment of the deposited film.

Attempts have also been made to increase the gas utilization efficiency in RF glow discharge plasmas by high power deposition of a dilute mixture of silane ($SiH_4$) in an inert carrier gas such as argon. However, this is known to result in undesirable film growth conditions giving rise to columnar morphology as reported by Knights, Journal of Non-Crystalline Solids, Vol. 35 and 36, p. 159 (1980).

The one group which has reported glow discharge amorphous silicon-hydrogen semiconductor alloy deposition utilizing microwave energy at 2.54 GHz treated the microwave energy as just another source of plasma excitation by performing the deposition in a plasma operating at pressures typical of conventional RF or DC glow discharge processes. C. Mailhoit et al. in the Journal of Non-Crystalline Solids, Vol. 35 and 36, p. 207-212 (1980) describe films deposited at 0.17 Torr to 0.30 Torr at deposition rates of between 23 and 34 Angstroms/Sec. They report that their films, which are of poor electrical quality, show clear indication of non-homogeneous structure. Thus, Mailhoit et al failed to find that for a given deposition system the minimum in the Paschen curve shifts to lower pressure values with increasing frequency. Therefore, the use of high frequency microwave energy in a glow discharge deposition system allows one to operate at much lower pressure without production of powder or inclusion of polymeric species in the amorphous semiconductor film. The shift in the minimum of the Paschen curve is believed to occur because, for a given gas pressure at the higher excitation frequency, the rapid reversals of the applied electric field allow the electrons in the plasma to collide with more feedstock molecules in the plasma excitation region before they encounter the walls of the system. Thus, operating at microwave frequencies provides both a substantially increased deposition rate, e.g., 100 Angstroms/sec. or above, and a feedstock conversion efficiency approaching 100%, while still allowing the production of high quality films. This contrasts both with the conventional RF (e.g., 13.56 MHz, 0.2 to 0.5 Torr) glow discharge deposition process which produces high quality films at deposition rates of approximately 10 Angstroms/sec. and feedstock utilization of approximately 10% and with the Mailhoit microwave process (2.54 GHz, 0.2 Torr to 0.3 Torr) which produced poor quality films at 20 to 30 Angstroms/sec. deposition rates.

Low pressure deposition, which is achieved with microwave plasmas without substantial increases in power allows for powderless depositions of a film with only small amounts of incorporated polymeric material. Still further, the higher frequency, and thus the more effective excitation results in the formation of reactive species not previously obtainable in sufficiently large concentrations with prior art processes. As a result, new amorphous semiconductor alloys can be produced having substantially different material properties than previously obtainable. All of the above results, by virtue of operation at microwave frequencies, and operation at lower pressures provide alloys having improved characteristics made at substantially increased rates. In addition, in order to operate in the most economic manner, it is further necessary to operate in the vicinity of the minimum of the Paschen curve.

As disclosed in the aforementioned referenced U.S. Pat. No. 4,217,374, new and improved amorphous and substantially amorphous semiconductor alloys and devices can be made which are stable and composed of chemical configurations which are determined by basic bonding considerations. One of these considerations is that the material is as tetrahedrally bonded as possible to permit minimal distortion of the material without long-range order. Fluorine, for example, when incorporated into these alloy materials performs the function of promoting tetrahedral bonding configurations. Amorphous semiconductor materials having such tetrahedral structures exhibit low densities of dangling bonds making the materials suitable for electronic and photovoltaic applications.

However, plasma deposited amorphous silicon-hydrogen alloys, as well as amorphous alloys of silicon and hydrogen with one or more of carbon, oxygen, and nitrogen suffer from various shortcomings. The hydrogen content of alloys deposited from hydride feed stocks is strongly dependent on substrate temperature, the content thereof decreasing at high substrate temperatures, and increasing at low substrate temperatures. For example, the presence of hydrogen in the alloy deleteriously effects the attainment of certain desirable properties of $SiO_2$, $Si_3N_4$, SiC, alloys or the like, such as corrosion resistance, hardness, etc. This is a direct consequence of hydrogen's role as a chemical bond terminator. As such, excess hydrogen disrupts the connectivity of the chemical bond network of the deposited film, reducing its average atomic coordination number. The hydrogen rich alloys have lower hardness, lower abrasion resistance, and lower corrosion resistance than stoichiometric materials.

Moreover, the use of pyrophoric hydride gases, as $SiH_4$, introduces hazards into the work place which necessitate the introduction of extra manufacturing costs e.g., for worker safety aid protection systems, insurance and the like. These costs, while they may be already a part of the manufacturing costs of, for example, crystalline silicon semiconductor devices represent new costs for manufacturers who will use plasma deposited coatings in activities such as manufacturing and stamping data storage discs, manufacturing plastic headlight and tail light lenses, and manufacturing opthalmic lenses.

The presence of large amounts of hydrogen in the deposited alloy reduces the hardness of the deposited alloys, limiting their utility as protective coatings.

Moreover, heating the substrate during deposition, e.g. to drive off hydrogen can damage temperatures sensitive substrates, as plastic substrates and substrates bearing electronic circuit elements and devices.

In the case of plastics, the inability to provide an adherent, abrasion resistant, substantially transparent coating impervious to moisture and oxygen on the plastic substrate without damaging or otherwise degrading the plastic substrate has limited the full potential of the transparent plastics and other soft substrates.

Plastics find many applications requiring the transmission, of optical energy. These applications include, for example, opthalmic and optical elements, windows and glazing units, and protective overlays, for example, protective overlays on optical data storage media and photovoltaically operatively activated devices.

Plastic overlays are used to protect optical data storage media. Information may be stored in the form of optically detectable differences in the properties of a medium, such as metal, an alloy, a phase change alloy, an organic or inorganic polymer, or an organic or inorganic dye. These media are particularly susceptible to environmental degradation, for example the effects of oxygen and moisture in the air. Heretofore these media have been protected by an organic polymeric overlay, as a poly (acrylate) overlay, e.g., poly (methyl methacrylate), or a poly (carbonate) overlay, as a bisphenol-A based heterochain polymeric overlay or an allyl carbonate heterochain polymeric overlay. However these optically transmissive polymers are water and air permeable and susceptible to surface degradation, as abrasion, scratching, and erosion. Even the slightest transport of air or water vapor across the barrier can force catastrophic failure of the information storage media. The surface degradation can cause skips, and incorrect data reading.

Plastic is also used as the refractive element in lenses, for example opthalmic lenses, photographic lenses, and telescope lenses. Especially preferred are polycarbonate and polyallyl carbonate polymers for opthalmic, sun glass, and safety goggle applications, and polymethyl methacrylate polymers for camera lenses, binocular lenses, telescope lenses, microscope objectives and the like. Plastic lenses have found good market acceptance and market penetration. However, the full potential of plastic lenses has been limited by their low resistance to abrasion, hazing, and scratching. Prior art abrasion resistant coatings, exemplified by polysilicate coatings and polysiloxane coatings, have not eliminated the problem of poor adhesion and poor abrasion resistance.

Plastic sheets with scratch and abrasion resistant coatings have found market acceptance in various automotive applications. These include headlight panels, parking light lenses, tail light lenses, sunroofs, side windows, and rear windows. However, the fuller utilization of plastic sheet material has been limited by the susceptibility of the plastic to scratching and abrasion, and the poor adhesion, and mismatch of thermal expansion coefficients between the plastic and the prior art protective coating.

Large area plastic sheets have also found utility in applications such as doors, windows, walls, air craft windows, air craft canopies, vandalism and break-in resistant panels, windows and doors, and esthetic barriers. However, the poor abrasion resistance of these large sheets have served to limit the full range of their market penetration capabilities.

Plastic materials have also been utilized to provide a shatter resistant layer for large sheets of glass. The glass-plastic structure is exemplified by bi-layer windshields. Bi-layer windshields have a single sheet of glass on the weather incident side of the windshield, and a polymeric film, for example a polyurethane film, adherent to the glass on the interior side. These bi-layer windshields have not found market acceptance because of the very poor resistance to scratching and abrasion of the internal, polyurethane coating thereof.

Other materials which require a hard coating are semiconductors, e.g., photosensitive semiconductors. Exposed layers of semiconductor alloy films, utilized in, for example, imagers, photovoltaic cells, electronic devices, and electrophotographic drums, are subject to abrasion, scratching, and hazing. Photovoltaic cells are subject to these insults during manufacturing and service, while imagers and electrophotographic drums are subject to the scratching, scraping, and abrading effects of rough sliding documents. In the case of electrophotographic drums, these effects are exacerbated by submicron, particulate toners.

SUMMARY OF THE INVENTION

The invention described herein allows for the independent control or even the elimination of hydrogen from the film while permitting deposition at an independently chosen substrate temperature. The thin films have controlled hydrogen content. By controlled hydrogen content is meant that the hydrogen content of the films is decoupled from the substrate temperature and can therefore be controlled independently of the substrate temperature. This allows achievement of a desired level of hydrogen content in the film to optimize parameters dependent on hydrogen e.g., elastic and plastic properties, and tensile, compressive, shear, and thermal expansion properties, or to eliminate hydrogen altogether where the desired properties are adversely affected by hydrogen. Decoupling of hydrogen content from substrate temperatures allows hard, corrosion resistance, abrasion resistant, and/or dielectric films to be deposited on temperature sensitive and/or thermally degradable substrates without damage thereto.

The present invention provides a process for the control or elimination of hydrogen from the deposit without any necessity of establishing or maintaining electron cyclotron resonance or near electron cyclotron resonance in the vicinity of the plasma. Thus, the deposition plasma is formed in a volume in which the magnetic fields present, if any, need not and can not create an electron cyclotron resonance condition or a condition approaching an electron cyclotron resonance condition. Extraneous magnetic fields, as terrestial magnetism and magnetic fields of nearby apparatus can be tolerated, and are not coupled to the plasma.

The present invention provides a process for depositing adherent, hard, hydrogen free or controlled hydrogen content, amorphous alloy films where the fluorine content is determined by the stoichiometry of the films, at substantially lower substrate temperatures, higher deposition rates, and lower hydrogen and fluorine contents than possible in the prior art. Even though deposition occurs at a higher deposition rates and lower substrate temperatures, the alloys exhibit high-quality properties suitable for many applications especially including hard coatings.

In accordance with the invention, the process includes the steps establishing a vacuum deposition region and positioning a substrate therein. A feedstock composition substantially free of hydrogen bonded to a heteroatom, as hydride hydrogen or acid hydrogen, is fed to this region. The feedstock includes a first gas compound or a mixture of first gas compounds of (a) the element or elements to be deposited, and (b) a reactive gasifier element which bonds with the element or elements to be deposited so as to produce a gas which will allow vapor transport of the desired element or elements, and a second gas, in substantial excess, which contains a scavenger for the reactive gasifier element of the first compound. The second gas may be in addition to the scavenger species elements or it may be a multielement compound containing an element to be deposited.

By a feed free of combined hydrogen is meant a feed stock that is: (1) free of hydrides, $M_x$-$H_y$ where M is a metal or semimetal other then hydrogen, (2) free of compounds of the type $H_yX_x$ where X is a semi-metal, and (3) free of hydrocarbons, hydrosilanes, and hydrogermanes, except to the extent that such compounds and $H_2$ may be added to the feed stock to controllably add hydrgen to the alloy.

The present invention provides a process for depositing adherent, hard films, hydrogen free or of controlled hydrogen content by plasma deposition of a gas mixture containing at least:

1. A first multielement gaseous compound of:
   a. a film constituent species; and
   b. an element that forms a compound with the film constituent species enabling the compound to be a gas at plasma decomposition temperatures and pressures, i.e., a reactive, gasifier element; and
2. A second gas, which may be either:
   a. a single element gas which acts as a scavenger for the reactive gasifier of 1-b, above, and which may, optionally, be incorporated into the film; or
   b. a multi-element gaseous compound, one element of which is incorporated into the film, and the other element of which primarily acts as a scavenger for the reactive, gasifier element and which may be incorporated into the film.

The reactive gasifier element is a ligand that enables the film constituent species—reactive gasifier compound to be a gaseous compound at plasma decomposition and/or deposition conditions. As such it must be chosen to covalently bond with the film constituent species creating a closed coordination shell, rather than having a tendency to form a network or to form ionic bonds.

For light elements (C, Si, B and P) as well as elements in Group IIIB (B,Al), Group IVB (C, Si, and Ge), and Group VB (P,As) fluorine is a reactive gasifier element providing gaseous compounds with a full coordination sphere. For certain metallic elements, as the metals of Groups IVA (Ti, Zr, and Hf), the reactive gasifier may be Cl, as in $TiCl_4$, $ZrCl_4$, and $HfCl_4$. For the metals of Group VA (V, Nb,Ta) and Group VIA (Cr,Mo, and W) the reactive gasifier may be either F or Cl, as $WF_6$, $MoF_5$, $NbF_5$, or $TaF_5$. For the iron triad (Fe,Co,Ni) and the lighter platinum group metals (Ru,Rh,Pd), carbonyls provide gaseous compounds.

The second gas, which scavenges the excess reactive gasifier, e.g., the fluorine or chlorine, may be nitrogen, or a nitrogen compound, as $N_2O$, NO, $NO_2$, $N_2O_5$, or $(CN)_2$.

A source of energy is activated and coupled to the feedstock gas to form a plasma. A portion of the plasma is positioned in proximity to the substrate onto which the low hydrogen alloy film is to be deposited. The vessel is maintained at a low enough deposition pressure to deposit the film at high deposition rates, and high gas conversion efficiencies without any significant powder or polymeric inclusions and the substrate need not be heated. The plasma excitation energy and the feedstock gases form a glow discharge plasma within the vessel to deposit an amorphous film onto the substrate. In a preferred exemplification the film is an alloy of silicon and/or germanium with nitrogen, carbon, oxygen, and/or boron. The feedstock gases can include silicon tetrafluoride ($SiF_4$), disilane hexafluoride ($Si_2F_6$), and higher homologues, germane tetrafluoride ($GeF_4$), and digermane tetrafluorine ($Ge_2F_6$), with $NO_2$, $N_2$, $N_2O$, cyanogen, halogenated hydrocarbons, or the like. The method of the invention can be used to deposit boron containing films, including boron nitride or boron carbide films from, e.g., a $BF_3$ and nitrogen containing feed stock gas in a glow discharge plasma.

The present invention also provides hydrogen free, or controlled hydrogen content hard, substantially transparent alloy coated plastic articles where the coatings hard, abrasion resistant, transparent coatings, characterized by high transparency and low absorption across a relevant portion of the visible or infrared spectrum.

In a particularly preferred exemplification a fluorinated feedstock gas, as a perfluorosilane, a perfluorogermane, or $BF_3$, is reacted in a plasma with a molecular compound of (1) an element or elements that preferentially scavenge fluorine, as nitrogen, to prevent fluorine etch removal of the deposit, and (2) an element that reacts with the metal or semi-metal of the perfluoro compound to form the multielement deposit. Exemplary reaction pairs, and products include, among others:

(1) $SiF_4$, $Si_2F_6 + N_2$, $N_2O$, $NO_2 \rightarrow Si_3N_4 + NF_3$
(2) $SiF_4$, $Si_2F_6 + NO_2 \rightarrow SiO_2 + NF_3$
(3) $SiF_4$, $Si_2F_6 + (CN)_2 \rightarrow SiC$, $Si_3N_4 + NF_3$
(4) $BF_3 + N_2 \rightarrow BN + NF_3$
(5) $BF_3 + (CN)_2 \rightarrow B_4C$, $BN + NF_3$
(6) $SiF_4$, $Si_2F_6 + BF_3 + NO_2 \rightarrow Borosilicate + NF_3$
(7) $SiF_4$, $Si_2F_6 + PF_3 + NO_2 \rightarrow Phosphosilicate + NF_3$ While these reaction gas feedstocks and products are shown with stoichiometric coefficients, it is to be noted that thin film deposits formed by condensation and reaction of plasma species may be substantially non-stoichiometric.

The method of the invention breaks (1) the necessity for hydrogen in the feedstock gas, and (2) the dependence of the hardness on high substrate temperatures heretofore required to drive off hydrogen, and provides a rapid, high deposition rate, high through-put process throughput for depositing hard coatings at low substrate temperatures.

Optically transparent, hard, protective coatings, for example, which are prepared utilizing the method of the invention are characterized by hardness, adhesion to the substrate, and optical smoothness, i.e., freedom from scattering.

By abrasion resistance is meant that the protective coatings have either or both of: (1) less than a 10 percentage point increase in haze by the method of either ASTM Standard D-4060-84, Abrasion Resistance of Organic Coatings by the Taber Abraser, or ASTM Standard D-1003-61 (1977), Haze and Luminous Transmittance of Transparent Plastics, or (2) less than 10 percent haze after 600 strokes by the method of ASTM Standard F-735-81, Abrasion Resistance of Transparent Plastics and Coatings Using the Oscillating Sand Method.

Absorption and optical transparency are functions of optical absorption and reflectance at the coating-substrate interface.

By optical transparency is meant that the optical absorption measured through a 3 micron thick film is less than 10 percent across a selected portion of the visible or infrared spectrum.

The present invention further provides a new and improved process for depositing optically transmissive hard coatings on substrates. The inventive process herein provides substantially increased deposition rates and reaction gas feed stock utilization. The films, coatings, and layers may be optically transmissive, and may be of compositionally and structurally controlled optical band gap. All of the above results are obtained by virtue of the present invention having improved optical and mechanical characteristics while being deposited at substantially increased rates, and feedstock gas utilizations.

The coated articles prepared thereby are characterized by surface toughness, high optical transmission through the deposited layer, and low reflectivity at the layer-substrate interface.

The method of the invention allows deposition to be carried out with the substrate below the temperatures at which organic polymeric substrate degrade, e.g., decompose, melt, soften, and/or undergo phase transformations, typically 170° C., as well as be below the temperatures at which thermal diffusion effects interfere with the operation of solid state junction devices, e.g., 380 degrees C. or lower, and even as low as 300° C., as well as at standard temperature (20°-27° C.) In this way thermal degradation of the underlying microelectronic circuit element substrates, data storage materials, or thermally degradable, e.g., plastic, substrates is avoided.

The low temperature method of the invention is especially useful in depositing hard alloys on substrates that are sensitive to thermal damage decomposition, or degradation. These substrates include organic polymeric substrates, as used in lenses, transparent articles, and optically transmissive coatings. Organic polymers of commercial interest have glass transition temperatures of from as high as about 170° C. or higher, in the case of bisphenol-A polycarbonates, polyacrylamides and poly (N-vinyl pyrrolidones) to as low as 75° to 105° C. in the case of such commercially important organic polymers as poly acrylic acids polystyrenes, polyacrylonitrides, polyvinyl chlorides, polymethyl methacrylates, diethylene glycol bis (allyl carbonates), and terephthalic acid polycarbonate. The herein contemplated hard coatings may be deposited on these organic polymeric substrates while maintaining the substrate temperature below 170° C., preferably below 75° C., and in a particularly preferred exemplification at room temperature, so as to avoid thermal degradation of the substrate.

The low temperature deposition process of the invention may also be utilized to deposit hard, optically transmissive, barrier layers atop data storage media, e.g., chalcogenide data storage media, magneto-optic data storage media, ablated data storage media, color change data storage media and the like. In this way damage to thermally sensitive data storage media is avoided.

According to a still further exemplification of the invention electronic features may be deposited e.g., as passivation layers, atop underlying electronic features of controlled dopant content without causing deleterious thermal effects on the dopant content or distribution, or to the function performed by the circuit element.

DESCRIPTION OF THE PREFERRED EMBODIMENTS

Figure 1:
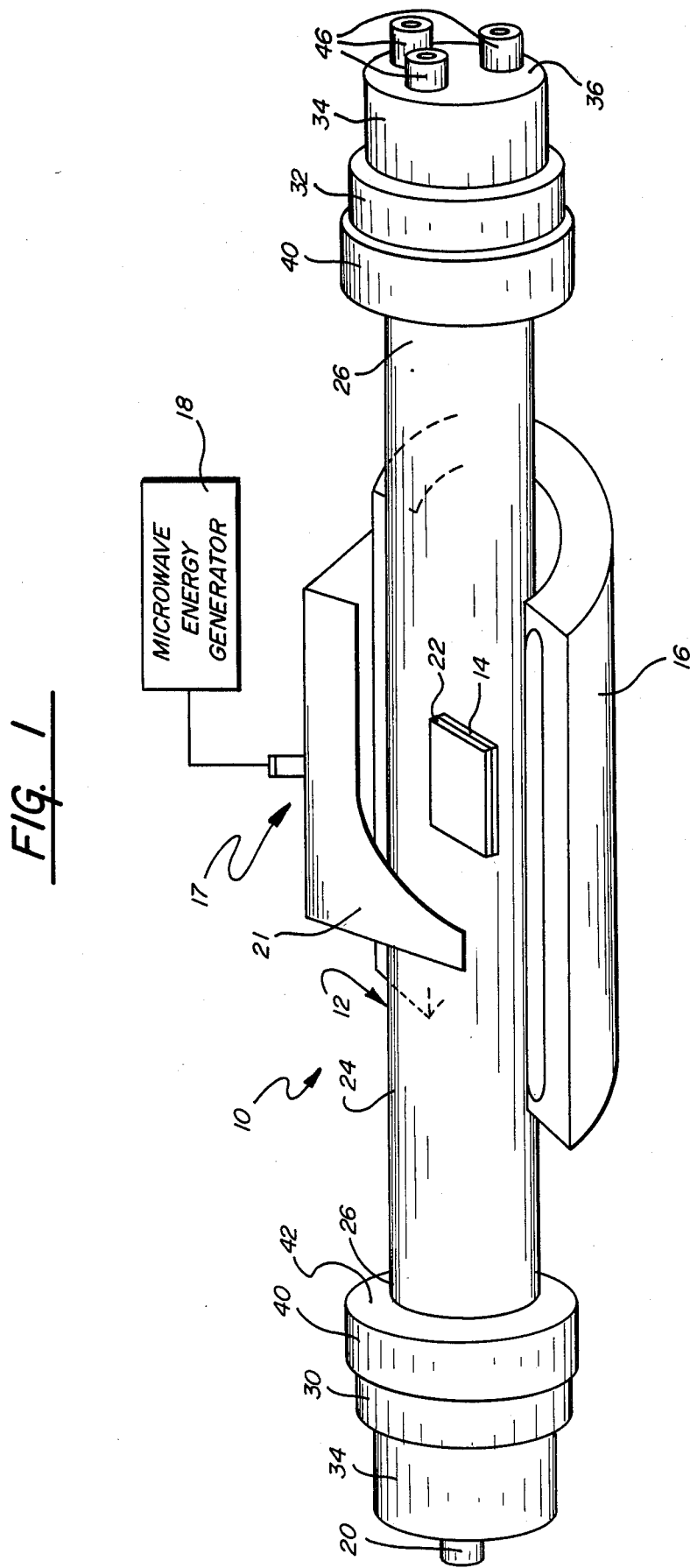
FIG. 1 is a perspective view, partly broken away, of a microwave plasma deposition system for depositing films in accordance with the process of the invention.

The present invention provides a process for depositing adherent, hard films, hydrogen free or of controlled hydrogen content, by plasma deposition. The plasma may be a d.c. plasma, a radio frequency plasma (e.g., a 13.56 mHz plasma), or a microwave plasma (e.g., a plasma excited by a frequency in the Gigahertz range, and exemplified by a 2.45 GHz excited plasma).

The feed stock gas mixture contains at least
1. A first multielement gaseous compound of:
   a. a film constituent species; and
   b. an element that forms a compound with the film constituent species enabling the compound to be a gas at plasma decomposition temperatures and pressures, i.e., a reactive, gasifier element; and
2. A second gas, which may be either:
   a. a single element gas which acts as a scavenger for the reactive gasifier of 1-b, above, and which may, optionally, be incorporated into the film; or
   b. a multi-element gaseous compound, one element of which is incorporated into the film, and the other element of which acts as a scavenger for the reactive, gasifier element, and which may also be incorporated into the film.

The feed stock gas mixture may also contain a plasma sustaining gas, as helium and/or argon, as well as controlled amounts of hydrogen ($H_2$) to provide a controlled hydrogen content in the deposit.

The reactive gasifier element is a ligand that enables the film constituent species—reactive gasifier compound to be a gaseous compound at plasma decomposition and/or deposition conditions. As such the reactive gasifier must covalently bond with the film constituent species, in a way which will not form a network e.g., as a metallic, polymeric, or crystalline network, or an ionic bond.

For light elements (c, Si, B and P) as well as elements in Group IIIB (B,Al), Group IVB (C, Si, and Ge), and Group VB (P,As) fluorine is a reactive, gasifier element providing gaseous compounds with full coordination spheres and the fluorides of these elements are preferred, as $CF_4$, $C_2F_6$, $SiF_4$, $Si_2F_6$, $BF_3$, $PF_3$, $AlF_3$, $GeF_4$, $GE_2F_6$, and $Asf_3$. Especially preferred are the perfluorosilanes, $SiF_4$, $Si_2F_6$, and $Si_3F_8$.

For certain metallic elements, as the metals of Groups IVA (Ti, Zr, and Hf), the reactive gasifier may be Cl, as in $TiCl_4$, $ZrCl_4$, and $HfCl_4$. For the metals of Group VA (V, Nb,Ta) and Group VIA (Cl,Mo, and W) the reactive gasifier may be either F or Cl, as $WF_6$, $MoF5$, $NbF5$, or $TaF5$. For the iron triad (Fe,Co,Ni) and the lighter platinum group metals (Ru,Rh,Pd), carbonyls provide gaseous compounds.

The second gas, which scavenges the excess reactive gasifier, e.g., the fluorine, may be nitrogen, or a nitrogen compound, as $N_2O$, $NO$, $NO_2$, $N_2O_5$, or $(CN)_2$. The scavenger element bonds with the reactive gasifier to form a chemical compound that is carried off at rates sufficient to remove reactive gasifier from the vicinity fo the substrate. This prevents etching of the deposit, and provides net film deposition.

The composition of the film, and especially the amount of incorporated reactive gasifier incorporated therein, is controlled by controlling the amount, i.e., the presence or absence of a stoichiometric excess, of the scavenger gas.

Referring now more particularly to FIG. 1, a microwave deposition apparatus suitable for practicing the process of the present invention, is generally designated 10. The apparatus 10 comprises a tubular chamber or vessel 12 containing a substrate 14 upon which the amorphous semiconductor alloy films are to be deposited. The substrate may, but need not be heated by a radiant heater 16. The exterior of the chamber is irradiated by an energy source 17 to the plasma. Reaction gases passing from inlets 46 to an outlet 20 at opposite ends of the chamber 12 receive plasma igniting and maintaining energy, e.g., microwave energy, from the source 17 in the area of the substrate. The combination of the reaction gases and the energy from the source 17 causes the formation of the plasma and the deposit of the film 22 in the area of the substrate.

In accordance with the present invention, the feedstock gases are substantially free of hydrogen compounds where hydrogen is bonded to another element, and include at least one multielement compound of an element to be deposited. Preferably the feedstock gas includes at least two components, one component being a halide of an element to be deposited, e.g., a fluoride or a chloride, and the other component including one or more elements, at least one element particularly adapted for scavenging the halogen, and at least one element forming the deposit, the two components being substantially free of hydrogen. The temperature of the substrate can be between room temperature and about 380 degrees Centigrade and the frequency of the microwave energy can be 2.45 Gigahertz and preferably above 2.45 Gigahertz. As mentioned, the combined plasma igniting and maintaining energy and the reaction gases form the plasma to permit the deposition process to proceed. During the process, the film 22 is spared from the potentially damaging effects of ion bombardment because of the reduced substrate self bias.

Referring now to FIG. 1 in greater detail, the tubular chamber 12 comprises a central quartz portion 24 and end portions 26 at opposite ends thereof. The end portions 26 are closed by a pair of end fittings 30 and 32 to complete the chamber. Each of the end fittings includes a sleeve portion 34 extending from a closed end 36 to an open end portion. The open end portion is threaded to receive a collar 40 having an inwardly extending annular flange 42 at one end thereof. An o-ring (not shown) is confined in a space between the flange 42 and the end portion for compression thereof against the quartz portion 26. An air-tight seal is provided in this way between the end fittings 30 and 32 and the tubular chamber 12.

The end fittings 30 and 32 are preferably made of stainless steel or other suitable non-corrosive metal, with the closed ends 36 being welded or otherwise permanently joined to the sleeve portions 34. The closed end 36 of the end fitting 32 is provided with gas inlets 46 through which the deposition gases are introduced into the vessel 12. An inert gas such as argon can be introduced through one inlet 46 to assist in sustaining the plasma.

The gas inlets 46 are preferably connected to a conventional gas rack (not shown) for establishing regulated flows of feedstock gases therein. The outlet 20 is provided at the closed end 36 to the end fitting 30 for connection to selectable first and second pumps. The first pump provides for initial evacuation of the chamber. The second pump provides withdrawal of unused reaction gases during operation and maintenance of the proper deposition pressure of about 1.0 Torr or lower, e.g. 0.004 to 0.01 Torr.

The energy source, e.g., a microwave energy source 17, preferably comprises a microwave energy generator 18 coupled to an antenna 19. The antenna 19 is housed within a reflective housing 21 for concentration of the microwave energy into the chamber 12. The antenna as illustrated is a vertical antenna being preferably one-quarter wavelength long. The tip of the antenna just touches the outer surface of the vessel 12 to maximize transmission of its output to the reaction gases.

Microwave excitation of a multicomponent, multielement feedstock gas, e.g, a feedstock gas of a perfluorosilane component and $N_2$ or a nitrogen compound component, forms a plasma that yields a hard, adherent deposit on a substrate 14 at temperatures as low as standard temperature (20°-27 degrees Centigrade). Thus, it is unnecessary to heat the substrate. However, the substrate may be heated if necessary, e.g., to control the morphology of the deposit. Heating may be done by radiant heater 16. The radiant heater 16 preferably comprises a conventional resistive heater. Heat is transmitted to the substrate 14 and the chamber 12 by radiation. Without significant direct heating of the reaction gases. Alternatively, a resistive heating arrangement (not shown) may be provided within the chamber 12 for heating the substrate 14. In that case, power lines for the heating element would be passed through the closed end 36 of one of the end fittings. According to a still further exemplification, cooling can be supplied to the substrate 14 or substrate carrier to prevent thermal degradation of the substrate.

In operation, the system 10 is first pumped down to below a desired deposition pressure such as $10^{-5}$ Torr. The feedstock gases, i.e., a hydrogen free, multielement, multiatomic halide compound of the metal or semimetal to be deposited, and a hydrogen free multiatomic molecular compound of the non-metal to be co-deposited therewith, and of the element to scavenge the halogen, are fed into the chamber 24. Exemplary are silicon tetrafluoride i.e., silane tetrafluoride, ($SiF_4$), disilane hexafluoride ($Si_2F_6$), and higher homologues thereof; germane tetrafluoride, digermane hexafluoride, and higher homologues; boron trifluoride, $BF_3$ and phosphorous trifluoride, $PF_3$, with the $N_2$, $NH_3$, $NO_2$, cyanogen $[(CN)_2]$, optimally with $O_2$, and/or a fluorocarbon. The feedstock gases are fed into the inlet chamber 24 through inlet conduits, as separate inlet conduits 46 and chamber 12 is brought up to the desired operating pressure of, for example, about an order of magnitude below that of a comparable r.f., e.g., up to about 0.05 Torr. The precursor feed stock gas is a hydrogen free gas. That is, it is free of combined hydrogen, silanes, partially halogenated silanes, hydrocarbons, and partially substituted hydrocarbons, and contains only enough molecular hydrogen, $H_2$ as may be necessary to control or modify the deposit properties. It is noted that the presence or degree of presence of $H_2$ is optional and controllable. In this way the total molecular and combined hydrogen content is maintained below the level at which the hydrogen's role as a chemical bond terminator disrupts the connectivity of the chemical bond network of the deposited film, reduces the average atomic coordination number in the deposit, thereby interferes with and harms the deposit. This maximum acceptable hydrogen level is determined by the end use of the coated article, and not by the kinetics, thermodynamics, and reaction path of the deposition process, as has heretofore been the case.

When the plasma is maintained by microwave energy, the microwave energy from the antenna 19 is directed by the reflective housing 21 into the vessel 12 to form a plasma in the area of the substrate. As a result, a film 22, such as a substantially optically transmissive, hard protective film 22, is deposited onto the substrate 14. The heater 16, when present, may maintain the substrate 14 at a temperature between about 20° Centigrade and a temperature below the onset of thermal degradation thereof. However, the use of a microwave excited per fluorosilane allows the substrate 14 to be at ambient temperature, obviating the necessity of a substrate heater. The output power of the microwave energy generator 18 is adjusted between about 20 and 120 watts depending on the volume of the gas contained in the plasma and the composition of the gas. These power outputs preferably correlate to about 0.1 to 1 watt per cubic centimeter in power density. The flow rate of the reaction gases can be between 1 to 50 SCCM. With the foregoing system parameters, deposition rates of 25A to 250A per second can be obtained.

If it is desired to increase the band gap of the material, band gap increasing elements such as carbon or nitrogen can be incorporated into the films by introducing a halocarbon, nitrogen oxide, nitrogen halide, or other non-hydrogen containing gas into the vessel during deposition. The reaction gases can be sequentially introduced to result in the formation of any desired layer morphology, composition, or mechanical properties.

To assist in the maintenance of the plasma, a plasma sustaining gas can be introduced into one of the inlets 46. Argon gas can be utilized for this purpose. While the method of the invention may be carried out with DC excited plasmas, and with AC excited plasmas, e.g., in the RF domain, the maximum benefits of the invention are obtained with a microwave maintained plasma. The deposition of substantially hydrogen free, hard alloy films by the foregoing inventive process utilizing a microwave initiated and maintained plasma has demonstrated many advantages over prior deposition processes. Firstly, the microwave energy provides a higher density of free radicals than previously possible. This results in higher deposition rates, nearly total utilization of the feed stock reaction gases. Secondly, the higher plasma electron temperature results in formation in the plasma of reactive species otherwise not obtainable and therefore one can deposit films containing unusual elements or combinations of elements or deposit films from unusual gas mixtures. This can result in new materials having unique compositional and structural properties.

By the term "amorphous" is meant an alloy or material which has long range disorder, although it may have short or intermediate order or even contain at times some crystalline inclusions. Pursuant to this definition, it should be noted that microcrystalline semiconductor alloy material will fall into the generic category of amorphous films.

Figure 2:
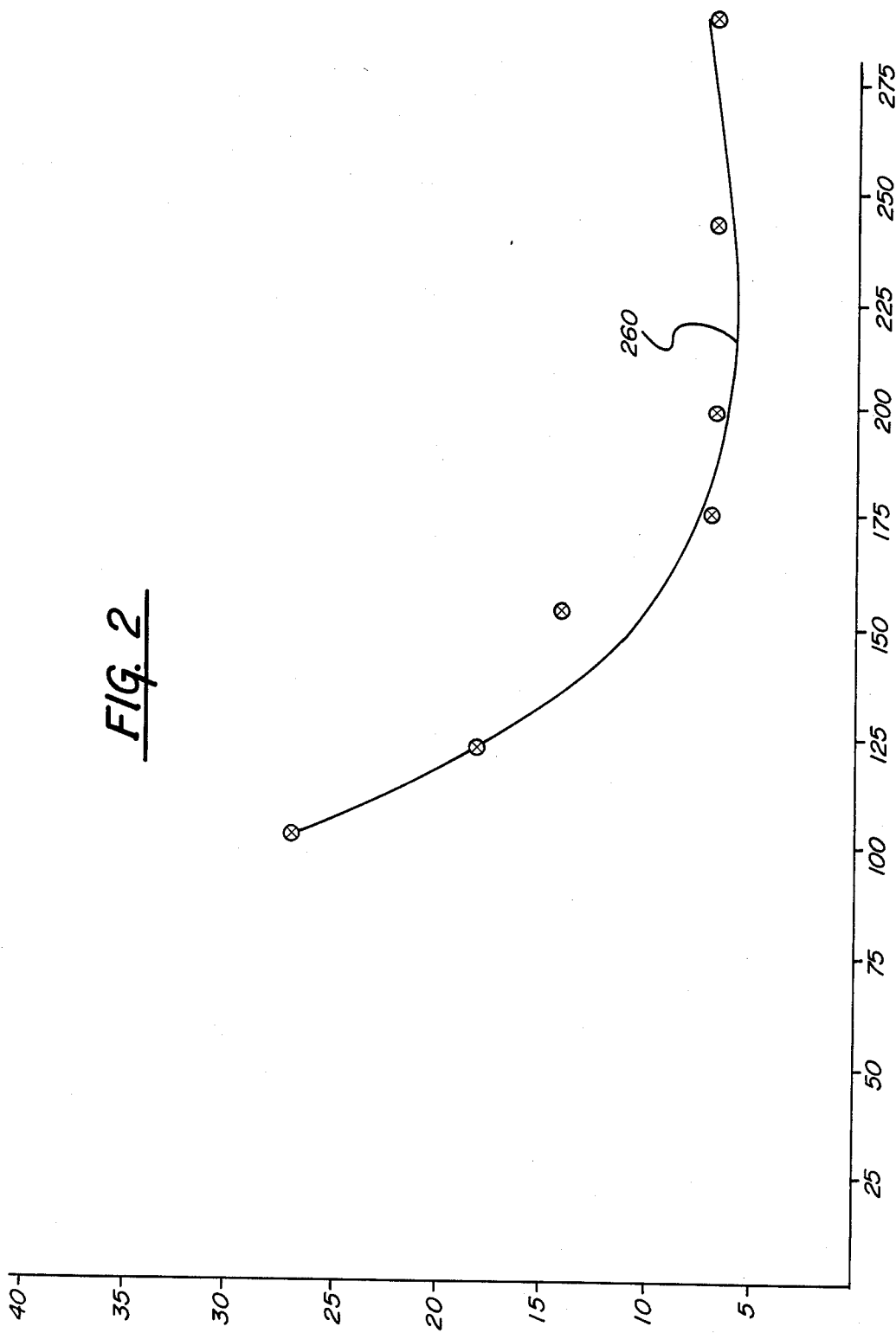
FIG. 2 is a modified Paschen curve for conventional RF deposition conditions.
Figure 3:
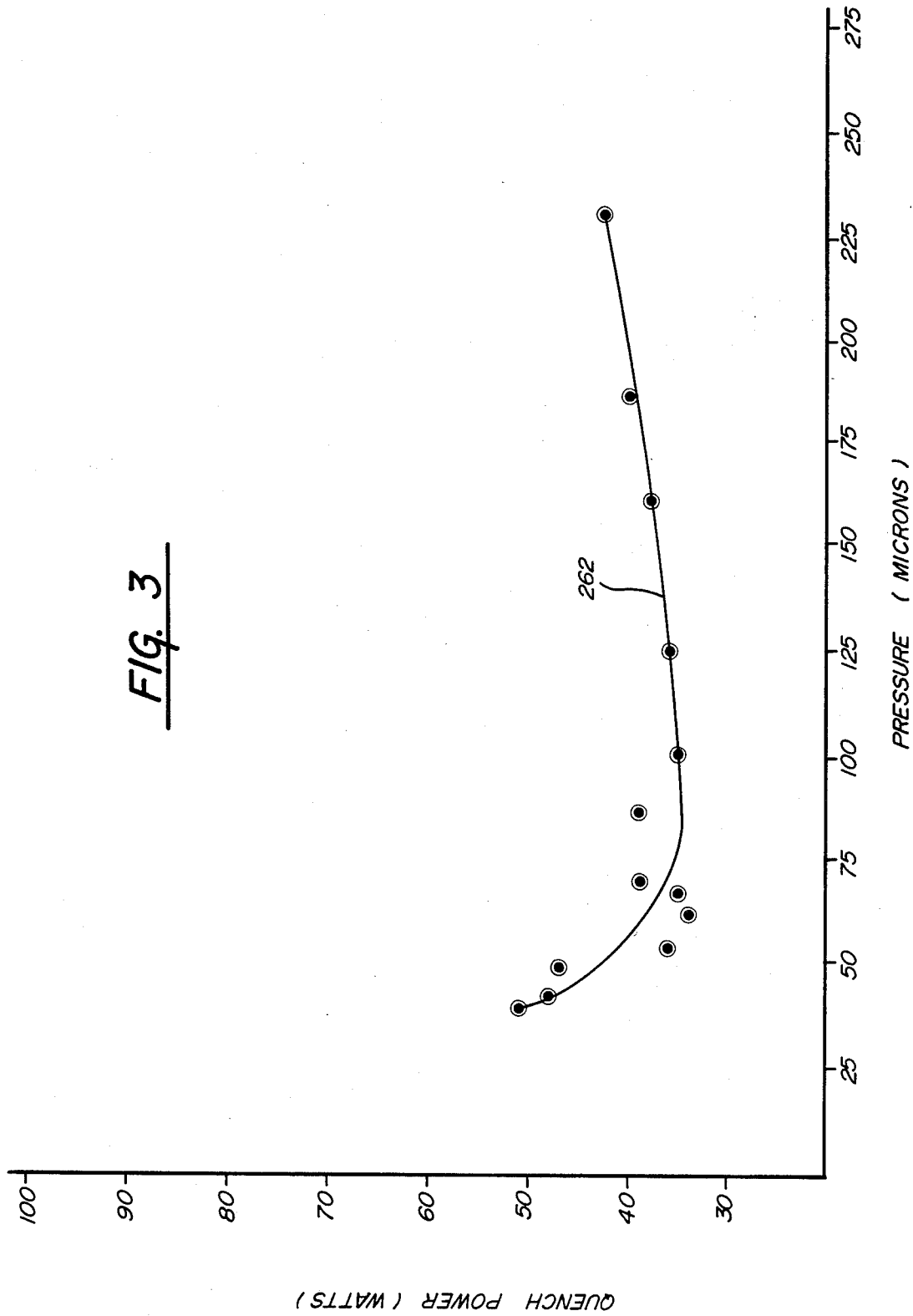
FIG. 3 is a modified Paschen curve for the microwave deposition conditions of the present invention.

FIGS. 2 and 3 are side-by-side comparisons of the modified Paschen curve for $SiH_4$. The curves are shown for $SiH_4$ rather then for $SiF_4$, because of the greater availability of data for $SiH_4$, enabling $SiH_4$ to be a standardized basis of comparison.

FIG. 2 illustrates a curve 260 which is produced utilizing conventional RF deposition techniques of $SiH_4$, which is a modified Paschen curve. The Paschen curve shows the voltage needed to sustain a plasma as a function of pressure. The modified curve is related to the power needed to sustain a plasma as a function of pressure. The normal operating range is dictated by the minimum of the curve, which for the curve shown is about 0.2 to 0.25 Torr.

FIG. 3 illustrates a modified Paschen curve 262 for the microwave deposition process of the invention again utilizing $SiH_4$ as the reaction gas. The curve 262 shows the clear shift in the curve to lower pressure for the microwave deposition process of the invention, which results in an operating range of about 0.075 to 0.1 Torr or below for the invention. The curve shifts for other reaction gases and deposition system dimensions.

Where a transparent coating, film, or layer is deposited, the hard, optically transparent, protective layer is characterized by an optical absorption through a 3 micron film of less than ten percent at a relevant bandwidth. The relevant bandwidth may be the visible spectrum (600 nanometers to 400 nanometers) or the infrared spectrum (longer than 600 nanometers and even longer than 700 nanometers). This requires an optical bandgap of greater than 3.5 electron volts for transmission in the visible spectrum, and greater than 2.5 electron volts for transmission in the infrared spectrum.

Exemplary, transparent, low cost, hard, abrasion resistant materials include the silicon compounds, especially the silicon carbides, $SiC_x$ with x from 0 to 2.0, the silicon nitrides $SiN_Y$ where y is from 0 to 4/3, the silicon oxides, $SiO_z$, where z is from 0 to 2, and related compositions as $SiC_xO_z$, $SiC_xN_y$, $SiN_yO_z$, and $SiC_xN_yO_z$, where x, y, and z are as defined above, and the sum of x/2 plus 3y/y plus z/2 approaches 1.00. Illustrative materials are:

The above described coatings may be deposited directly on the substrate. Alternatively, an inner layer or underlayer may be deposited directly on the substrate, with the above described hard coating deposited atop the inner layer or underlayer. The inner layer or underlayer may serve as a stress relieving layer, allowing bending of the laminate and reducing the tendency for stress cracking in the dielectric layer. This allows a thicker layer to be deposited. This also allows a flat substrate as a thermoplastic film or sheet to be coated with the inner layer and the external hard layer and thereafter shaped or formed, i.e., bent, molded, extruded, drawn, oriented, or otherwise thermoformed, without cracking, crazing, hazing, or delumination. The coating may be deposited on a large flexible plastic substrate at one site or factory in one apparatus by one manufacturing enterprise, and the coated plastic substrate shaped or formed in another apparatus, or at a different site or factory, and even by a different manufacturing enterprise.

The underlayer or inner layer may also act as an optical filter, being of controlled band gap, so as to selectively block portions of the spectrum, as ultraviolet and/or blue light.

The inner layer, when present, should be formed of a material that is compatible with the substrate in one or more of coefficient of thermal expansion, modulus of elasticity, plasticity, or lattice dimensions. In one embodiment the inner layer is deposited carbon. The deposited carbon may be amorphous, microcrystalline, or polycrystalline, and may exhibit tetrahedral short range order and/or graphitic short range order. The carbon may be deposited by sputtering a carbon target, chemical vapor deposition, glow discharge from a halocarbon feedstock gas, or microwave deposition fro a halocarbon feedstock gas. Especially preferred is microwave deposition from a halocarbon feedstock gas followed by microwave deposition of silicon alloy coating from a fluorosilane-nitrogen containing feedstock gas without breaking vacuum.

According to a particularly preferred exemplification, the inner layer of the dielectric is formed of an alloy hydrogen and the same constituents as the outer portion of dielectric. The hydrogen content of the inner layer of the dielectric is controlled by introducing a separate hydrogen containing feedstock gas, as a hydride, e.g., silane or germane, or molecular hydrogen. As the deposition rate and substrate temperature are controlled independently of the hydrogen feed rate, it is possible to incorporate hydrogen at a concentration that will relieve stresses within the dielectric layer, thereby reducing hazing, crazing, and delamination.

Typically the inner layer, whether a carbonaceous under layer or hydrogen alloy inner layer, may be of uniform composition and properties or of graded composition and properties.

The inner layer, when present, has a thickness of from about 0.05 micron (500 Angstroms) to about 2 micron, with a thickness of about 0.1 micron to 1.5 micron being particularly preferred for stress relieving $SiO_2$ alloys on polycarbonates and polymers of like mechanical and thermal properties.

According to a further exemplification there may be multiple inner layers or under layers. For example the coating may contain a gas-impervious intermediate layer, as a $Si_3N_4$ layer, to hermetically seal an environmentally degradable substrate, as polycarbonate, or polyurethane, from oxygen and/or water vapor, an outer layer of, e.g., $SiO_2$, for hardness, and an adhesion layer or layers, e.g., of C or $SiO_2$, or both C and $SiO_2$ for adhesion, bonding, and mechanical parameter matching.

According to this exemplification a polycarbonate or polyurethane substrate may have a hard coating and be protected from moisture and/or $O_2$ by a multilayer coating of (1) $SiO_2$, e.g., as an adhesion layer, (2) $Si_3N_4$, e.g., as a hermetic seal layer, and (3) $SiO_2$, e.g. as a hard outer layer. The $SiO_2$ layers have a thickness of about 1 to 2.5 microns, and the $Si_3N_4$ layer has a thickness sufficient to substantially prevent the permeation of gas, as $O_2$ or $H_2$, therethrough, e.g., about 0.5 micron to 2 microns thick.

Alternatively, a carbon film may be deposited on the substrate, and the layers of $SiO_2$ and $Si_3N_4$ deposited sequentially, e.g., as described above, atop the carbon layer. When stoichiometric are referred to above, it is to be understood that such stoichiometries are approximate, that actual composition may deviate therefrom, and that $-F$ may be incorporated therein.

According to a still further exemplification, a multilayer coating may be deposited having an inorganic photochromic or electrochromic composition, as a hexa-coordinated tungsten composition, encapsulated between hermetically sealing layers of silicon nitride, with an external layer of silicon oxide. The photochromic may be deposited by low temperature CVD, from organic solution or by condensation from an organic vapor, as is well known in the art. This multilayer coating may be deposited atop, e.g., a poly(acrylic), poly(carbonate), or poly(allyl glycol carbonate) homopolymer, copolymer, or interpolymer substrate, optionally with a carbonaceous and/or silicon oxide containing bottom layer, a first silicon nitride encapsulating layer, the photochromic or electrochromic layer, a second silicon nitride encapsulating layer, and an external layer of silicon dioxide. Alternatively, the first silicon oxide layer may be dispensed with and the photochromic or electrochromic layer deposited onto the silicon oxide and/or carbon containing under layer, or even directly onto the organic polymeric substrate.

Microwave plasma deposited protective, optically transmitting layers meeting these criteria find utility in combination with optically transmissive organic polymeric substrates.

Exemplary organic polymers which may be used to provide the organic polymeric substrates include carbon chain polymers such as the polyolefins, styrene and divinyl benzene based polymers, diecnes, vinyls, acrylics, and fluorocarbons. Exemplary polyolefins include polyethylene, polyethylene-polyvinyl acetate copolymers, polyethylene-polyethyl acrylate copolymers, polyethylene-polyacrylic acid copolymers, polypropylene-polymethacrylic acid copolymers, polypropylene, polyethylene-polypropylene copolymers, polyethylene-polypropylene-polydiene terpolymers, chlorinated polyethylene, chlorosulfonated polyethylene, polyisobutylene-polyisoprene copolymers, and poly 4-methyl pentene-1. Exemplary aromatic carbon chain polymers include polystyrene, polystyrene-acrylonitrile copolymers, polystyrene-polybutadiene copolymers, polystyrene-divinylbenzene copolymers and terpolymers and polystyrene-polyester copolymers. Exemplary diene polymers include polybutadiene, polybutadiene-polyacrylonitrile copolymers, polyisoprene, polychloroprene, polyisoprene-polystyrene copolymers, and polyisoprene-polymethyl methacrylate copolymers. Exemplary vinyl polymers include polyvinyl chloride, polyvinylidene chloride, polyvinyl chloride-polyvinylidene chloride copolymers, polyvinyl chloride-polyvinylidene chloride, polyvinyl chloride-polyethylene, polyvinyl acetate, polyvinyl chloride-polyvinyl acetate, hydrolyzed polyvinyl acetate, also known as polyvinyl alcohol, poly N-vinyl pyrrolidone, poly 2-vinyl pyridene, poly vinyl-methyl ether, poly vinyl formal, poly vinyl butyral, and poly acrylic acid-polyethylene copolymers. Exemplary acrylic polymers include polymethacrylic acid, polyethyl acrylate, polymethylmenacrylate, polyethyl acrylate-poly methyl melhacrylate copolymers, poly methyl methacrylate-polystyrene copolymers, and polyacrylamides. Exemplary fluorocarbons include polyvinyl fluoride, poly tetrafluoroethylene, polychlorotrifluoroethylene, polyperfluoropropylene, polyvinylidene fluoride, polyperfluoropropylene-polytetrafluoroethylene copolymers, polyperfluoropropylene-polyvinylidene fluoride copolymers, and polyvinylidene fluoride-poly chlorotrifluoroethylene copolymers. The above enumeration is intended to be illustrative and not exclusive and the useful polymers include various analogs, homologs, and adducts thereof. Especially preferred carbon chain polymers include high density, crystalline polyolefins, with a molecular weight above about 100,000.

The method of this invention is also useful in providing hard coatings on substrates of heterochain polymers such as polyesters, polyethers, polyamides and polyimides, polyols, polyurethanes, and polysilicones. Exemplary polyesters include alkyds (as alkyd films having the herein contemplated and described dielectric coatings therein), gylcol-maleic acid anhydride ester polymers, glycol-allyl carbonate polymers (as allyl glycol carbonate polymers, exemplified by diethylene glycol bis(allyl carbonate)), saturated ester polyesters as terephthelate polyesters, and polycarbonates (e.g. bisphenol-A polycarbonates and diphenyl carbonate polycarbonates) and polylactones. Exemplary polyethers, include polyacetal, polyalkylene oxides (as polyethylene oxides, polypropylene oxides, and polyepichlorohydrin), urethane-polyol copolymers, polytetrahydrofuran, polyphenylene oxides, and polysulfones. Exemplary useful polyamides and polyimides include nylons, "dimer acids", aryl nylons, the polymeric reaction products of, e.g., 4-4'-Diaminophenyloxide and pyromellitic dianhydride, and the polymeric reaction products of diphenylisophthalates. Exemplary polyals include the melamines. Exemplary useful polyurethanes include those used to form elastomers (as cast and thermoplastic polyurethanes) by the reaction of a diisocyanate, methylene-bis (4) phenyl isocyanite, or hexamethylene diisocyanate, optionally with a chain extending agent, and a diol, as a polyester diol. The above enumeration of heters chain polymers is intended to be illustrative and not exclusive or limiting. The monomers may be homopolymers or copolymers, as terpolymers. The copolymers may be random copolymers or block copolymers.

While the organic polymeric substrate is generally substantially cured prior to deposition of the transparent, multielement alloy film, the organic polymer may be partially polymerized, i.e., still containing monomeric bonds, e.g., gummy and viscous, or even having liquid portions, and may contain a photoinitiatar or photocatalyst, which completes the polymerization or cure during the glow discharge deposition of the multielement alloy. For example the organic polymeric substrate may contain a partially polymerized vinyl or acrylic material and an optical radiation or ultra violet initiated catalyst, as riboflavin-S-phosphate and sodium, which is initiated by the optical or U.V. radiation from the plasma, to increase the degree of polymerization and further bond the multiple element alloy to the organic polymeric substrate.

Figure 4:
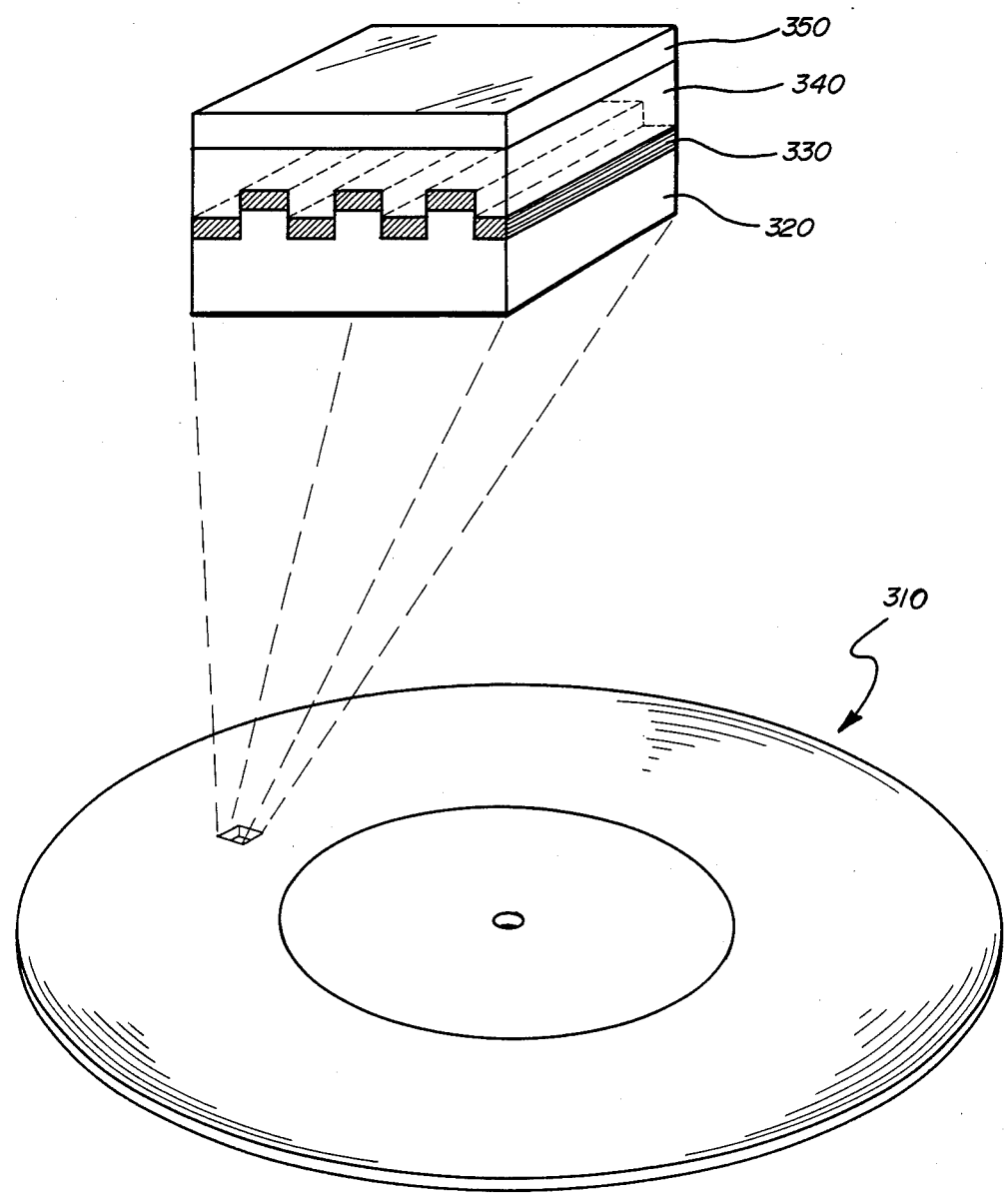
FIG. 4 is a cutaway view, not to scale, of an optical data storage device having the hard coating overlay of the invention.

FIG. 4 shows an optical data storage device 310 as disk 310. The disk 310 includes a grooved substrate 320, carrying a data storage medium 330, and overlaid with a plastic protective overlay 340. Information is stored in the data storage medium by changing the state thereof, e.g., the microstructure, the surface morphology, the reflectivity, the presence or absence of bubbles or hollows, or ablation of the medium. The individual memory cells of the disk 310 are small, on the order of 0.1 to 2.0 microns. As a result, any scratches, pits, gauges, imperfections, dust, or the like in the plastic overlay 340 can give rise to improper readings, skips, or the like. However, these defects in the optical path through the plastic overlay 340 are substantially reduced by the hard, optically transmissive protective layer 350.

Figure 5:
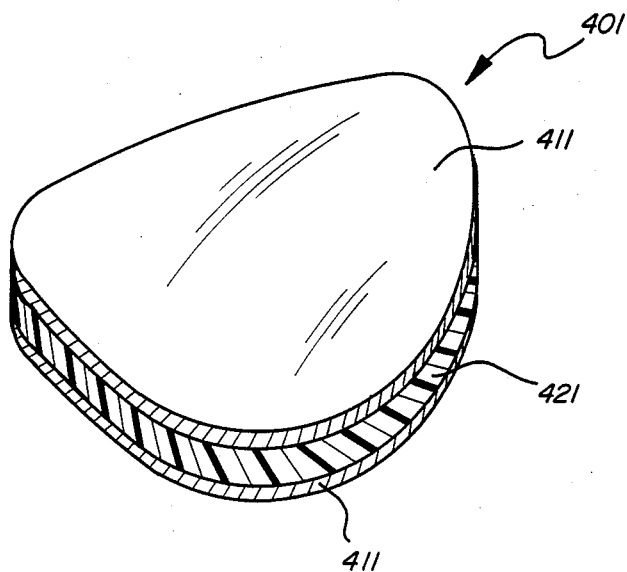
FIG. 5 is a partial isometric view, not to scale, of a coated plastic lens.

FIG. 5 shows an opthalmic lens 401 having a plastic substrate 411 with the herein contemplated hard coating 420 therein. The plastic substrate may be a polycarbonate a polyacrylate, such as poly(methyl methacrylate) or a poly(allyl carbonate) such as PPG Industries "CR-39" (R) diethylene glycol bis (allyl carbonate), polymerized with a suitable peroxide initiator to form a hard, substantially light transmissive polymer.

The coating 420 is generally from about 1 to about 10 microns thick and particularly from about 2 to about 5 microns thick. It may be a graded coating, with a carbon underlayer, as a vacuum deposited carbon coating, film, or layer of 0.5 to 2.0 micron thickness, and of graphitic or partially graphitic structure, and a silicon alloy layer atop the carbon layer. The silicon containing alloy layer may be comprised of: silicon dioxide, silicon carbide, silicon nitride, silicon carboxynitride, or other microwave deposited, transparent silicon alloy hard coating.

The coating 420 may be of narrow optical band gap so as to block and/or reflect certain optical band widths, i.e., as an optical filter. When the hard coating 420 is utilized as an optical filter, the coating is a multi-layer coating with a deposited carbon underlayer on the plastic substrate 411. The carbon, e.g., the deposited amorphous, graphitic or tetrahedrally coordinated material may have an optical band gap to selectively absorb blue and ultraviolet.

The plastic substrate could also be a plastic optical fiber, or laser mirror, or a plastic sheet, as a door, window, sun roof insert, or the like.

Figure 6:
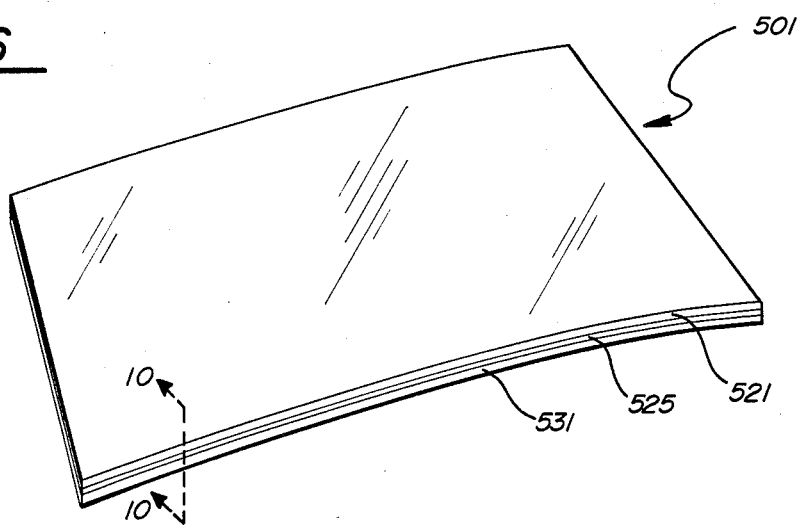
FIG. 6 is a partial isometric view of a bi-layer windshield having the hard coating on the exposed surface of the plastic.
Figure 7:
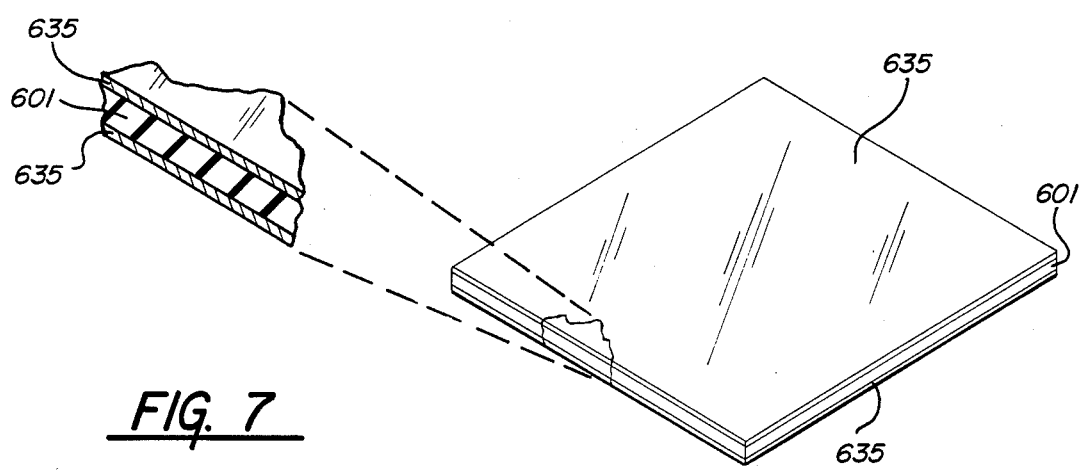
FIG. 7 is a partial cutaway view through cutting plane 5-5 of the windshield of FIG. 6 showing the glass substrate, the polyvinyl alcohol adhesive, the polyurethane bi-layer, and the hard coating.

According to a further exemplification of the invention the coated article may be a glass-plastic laminate having the contemplated hard coating on the surface of the plastic unprotected from the glass. Exemplary is a windshield 501 as shown in FIGS. 6 and 7. However the article could be a window, a storm door glazing unit, or a sliding door glazing unit.

The windshield 501 includes a glass substrate 521 with a thin adhesive layer 523 of, for example, polyvinyl alcohol, and a plastic film 525, for example a substantially water white polyurethane. The hard coating for example the silicon carbide, silicon nitride, or silicon oxide hard coating 531 is on the unprotected surface of the plastic layer 525. This results in a significant reduction in abrasion and scratching of the plastic 525.

Figure 8:
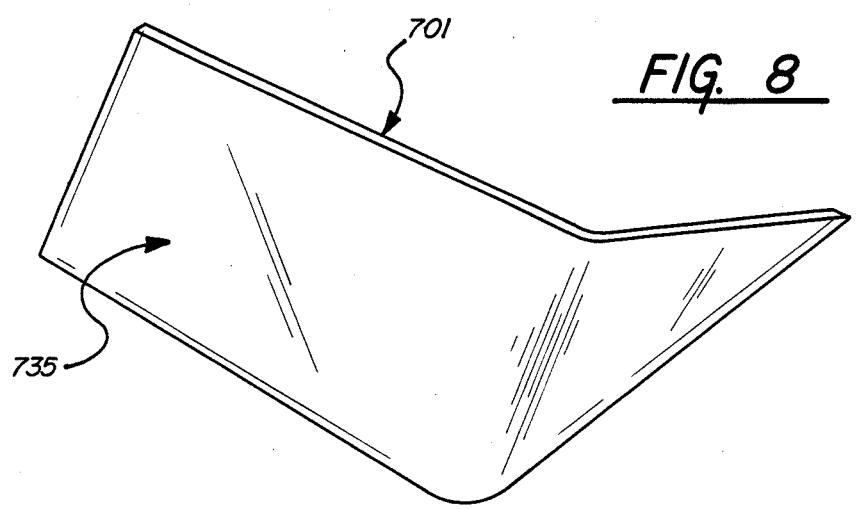
FIG. 8 is a partial cutaway view of a plastic window having a hard coating on both external surfaces.

An alternative exemplification is shown in FIG. 8. The exemplification shown in FIG. 8 is a plastic sheet 601 having the hard coating 635 on at least the surface exposed to abrasion. Alternatively, hard coatings 635 may be on both surfaces of the plastic sheet 601. In this way both the weather incident surface and the interior surface have abrasion resistant coatings.

Figure 9:
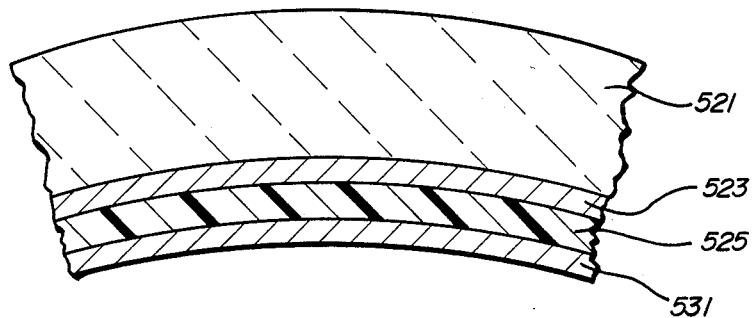
FIG. 9 is a partial cutaway view of a plastic headlight lens having a hard coating thereon.

A still further exemplification is shown in FIG. 9 where a plastic head light lens 701 is shown. The plastic head light lens 701 has a plastic substrate, as an injection molded plastic substrate 701, with a thin film of the herein contemplated hard coating deposited thereon.

According to a still further exemplification of the invention the film is used as a passivation layer for an electronic device or as an interlevel insulator gate dielectric for a MOSFET, such as a $Si_3N_4$ or $SiO_2$ thin film, and especially on $Si_3N_4$ film, optionally containing fluorine. The dielectric is deposited at a low device temperature, that is, at a temperature low enough to avoid diffusion ofsharp profiles of ion implanted dopants across.

According to a still further exemplification, a feedstock gas of a halocarbon, as $CF_4$ or $C_2F_6$, boron trifluoride, and a nitrogen source, as $N_2$ or cyanogen $(CN)_2$, can be decomposed by microwave energy to form a precursor gas that deposits to form a disordered boron-carbon coating. The disordered boron-carbon composition, which may have proportions approaching $B_4C$, is a hard material useful as, for example, a wear coating, as on razor blades, scissors, cutlery, cutting tools, and the like. Thus, in one particularly preferred exemplification a disordered $B_4C$ coating of about 0.5 to 5 microns thick is applied to a cutting surface, as a scissor, razor blade, or knife, by the microwave plasma decomposition of a feedstock gas of (1) at least one alocarbon chosen from $CF_4$, $C_2F_6$, and volatile homologous thereof; (2) $BF_3$, and (3) a nitrogen source as $N_2$ or $(CN)_2$. An $NF_3$ gas is recovered during the deposition.

Figure 10:
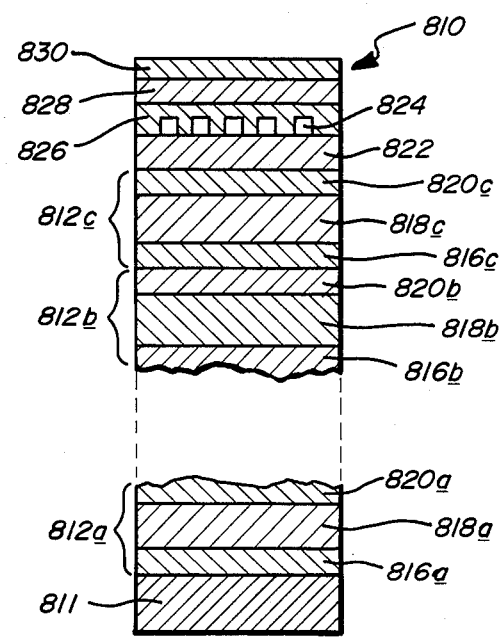
FIG. 10 is a partial cutaway view of a photovoltaic cell having a hard, trasparent coating of the invention.

Referring now to FIG. 10 a photovoltaic cell, formed of a plurality of successively deposited n-i-p layers, each of which comprises a substantially amorphous thin film semiconductor alloy material is shown generally by the reference numeral 810.

More particularly, FIG. 10 shows a tandem n-i-p type photovoltaic device, such as a solar cell, made up of individual n-i-p type cells 812a, 812b and 812c. Below the lowermost cell 812a is a substrate 11 which may be formed of a transparent glass or synthetic polymeric member; or formed from a metallic material such as stainless steel, aluminum, tantalum, molybdenum, chrome; or formed from metallic particles embedded within an insulator. Although certain applications may require the deposition of a thin oxide layer and/or a series of base contacts prior to the deposition of semiconductor alloy material, the term "substrate" shall include not only a flexible film, but also any elements added thereto by preliminary processing. Also included within the scope of the present invention are substrates formed of synthetic polymers and metals coated with a synthetic polymer to which one or more conductive base electrodes are applied.

Each of the cells 812a, 812b and 812c are preferably fabricated with a thin film semiconductor body containing at least a silicon or silicon:germanium alloy. Each of the semiconductor bodies includes a p-type conductivity semiconductor layer 820a, 820b and 820c; a substantially intrinsic semiconductor layer 818a, 818b and 818c; and an n-type conductivity semiconductor layer 816a, 816b and 816c. Note that the intrinsic layer may include traces of n-type or p-type dopant material without forfeiting its characteristic neutrality, hence it may be referred to herein as a "substantially intrinsic layer". As illustrated, cell 812b is an intermediate cell and, as indicated in FIG. 13, additional intermediate cells may be stacked atop the illustrated cells without departing from the spirit or scope of the present invention. Similarly, the tandem cell may include only two stacked cells. Also, although n-i-p photovoltaic cells are illustrated, this invention may be advantageously practiced with differently configured photovoltaic cells including single or multiple p-i-n cells, Schottky barrier cells, p-n cells as well as with any other semiconductor device having an appropriate top electrode. The term "n-i-p type: as used herein is meant to include any aggregation of n, i and p layers operatively disposed to provide a photoactive region for generating charge carriers in response to the absorption of photon energy.

It is to be understood that following the deposition of the layers of semiconductor alloy material, a further deposition process may be either performed in a separate environment or as a part of a continuous process. In this step, a TCO (transparent conductive oxide) layer 822, preferably formed of a material such as tin oxide, indium oxide, indium tin oxide, zinc oxide, cadmium stannate or combinations thereof is added atop the p-layer 820c of the top most cell 812c, to function as the top electrode of the cell 10. An electrode grid 824 may be added to the device where the cell is of a sufficiently large area, or if the conductivity of the TCO layer 822 is insufficient to obtain efficient collection of photogenerated current. The grid 824 is adapted to shorten the carrier path and increase the conduction efficiency. As discussed previously, the intrinsic layers 818a, 818b and 818c of the cells 812a, 812b and 812c may be and preferably are formed from semiconductor alloy materials having different bandgaps. For example, intrinsic layer 818c of cell 812c may have a band gap of approximately 1.7 eV, intrinsic layer 818b of cell 812b may have a band gap of approximately 1.5 eV and intrinsic layer 818a of cell 812a may have a band gap of approximately 1.3 eV. In this manner, the most efficient use may be made of a large portion of the incident solar spectrum.

It is to be noted that heretofore a solar cell, shown generally as 810, included a layer of about 18 mil thick transparent flowable organic resin (such as EVA (ethyl vinyl acetate)), generally 826 in FIG. 10, which resin would adhere to the subjacent transparent conductive oxide 822 and grid structure 824 as well as provide for step coverage of that non-planar grid structure. The EVA, by itself is characterized by excellent weatherability and no UV absorbtions. However, due to the fact that the layer of flowable organic resin 826 was soft, an outer layer of about a 2–4 mil thick, relatively hard, transparent laminate, generally 828, provided the outer environmental protection covering. An example of such a laminate was TEDLAR (registered trademark of Dupont Corporation). The problem with the use of such a laminate was that it had additives added thereto in order to prevent ultra-violet degradation, which additives result in short wavelength light absorption giving an overall 8-12 percent loss in transmissivity. Further, when heated to 130° to 140° C. to secure the laminate, the EVA would lose transmission of UV wavelengths of incident light. As should be apparent to those ordinarily skilled in the photovoltaic art, such a loss of transmissivity in the laminate translates directly into a substantial loss in solar cell efficiency since portions of incident radiation never reach the photogenerative layers of semiconductor alloy material.

Other organic resins which do not absorb as much incident radiation proved to be too soft to serve as environmental protecting laminants for solar cell usage. For instance, FEP (fluorinated-ethylene-propylene) has a relatively soft and reflective outer surface which prevents its use as a hermetic seal for cells.

Through the inventive efforts of the subject inventors, it is now possible to utilize transparent laminates such as FEP with a hard, protective, abrasion resistant, hermetic overcoat, shown generally as 830 in FIG. 10. More specifically, the wide bandgap silicon oxi-nitrides, silicon oxides or silicon carbides discussed hereinabove, provide a hard, transparent, flexible, adherent laminate. It is further possible to deposit said hard coatings directly upon the flowable organic resin (such as EVA) 826 or, where step coverage is not a problem, directly upon the TCO layer 822.

The invention may be understood by reference to the following examples.

EXAMPLES

A series of polycarbonate substrate coupons were coated with alloy hard coatings. In each test a coupon was placed in a vacuum vessel coupled to a source of 2.45 Gigahertz microwave energy. The vacuum vessel was sealed, purged with argon, and pumped down. A feedstock gas mixture was introduced in the vacuum vessel, the microwave energy source energized to initiate and maintain a plasma, and the pressure is adjusted and maintained at 3.5 millitorr.

The feedstock gas had the composition shown in column 1 (atomic %). The substrate temperature is shown in column 2. The resulting coating had the thickness shown in column 3, and the composition (atomic %) shown in column 5.

TABLE I

| Column 1 Gas Composition (Atomic %) | Column 2 Substrate Temperature (°C.) | Column 3 Thickness (Micron) | Column 4 Coating Composition or Chemical Bonding Ratios (Atomic %) |
|---|---|---|---|
| $SiF_4$ - 83%<br>$N_2$ - 17% | 40° C. | 0.05 | Si - 47%<br>N - 38%<br>F - 15% |
| $SiF_4$ - 6.9%<br>$N_2O$ - 23.6%<br>Ar - 69.6% | 23° C. | 1.25 | Si - 28%<br>O - 70.6%<br>F - 1.4% |
| $SiF_4$ - 16.3%<br>$N_2$ - 81.5%<br>$BF_3$ - 10% | 23° C. | 0.80 | $Si_3$ - N/B - N<br>=11 |
| $SiF_4$ - 15%<br>$N_2$ - 75%<br>$BF_3$ - 10% | 23° C. | 1.25 | $Si_3$ - N/B - N<br>=1 |
| $SiF_4$ - 7.6%<br>$N_2$ - 81.5%<br>$BF_3$ - 10.9 | 23° C. | 0.53 | $Si_3$ - N/B - N<br>=0.4 |

The analyses for $SiO_2$ and $Si_3N_4$ were done by Auger, and the analysis in the $SiF_4$—$N_2$—$BF_3$ samples were done by infra red spectroscopy.

While the invention has been described and illustrated with respect to microwave plasmas, other high energy plasmas capable of disassociating the precursor compounds, and providing the same reaction pathways and reaction conditions may be used without departing from the scope of the invention.

Modifications and variations of the present invention are possible in light of the above teachings. It is therefore, to be understood that within the scope of the appended claims the invention may be practiced otherwise than as specifically described.

What is claimed and desired to be secured by Letters Patent of the United States is:

1. A method of depositing on a substrate a multiple element alloy of controlled hydrogen content comprising the steps of:
    a. establishing a vacuum deposition region and positioning a substrate therein;
    b. providing a plurality of feedstock gases free of chemically combined hydrogen, at least one of said feedstock gases containing an element or elements which are components of the multiple element alloy in chemically bonded form with a reactive gasifier element and at least another one of said feedstock gases containing at least one scavenger element capable of preferentially bonding with and scavenging said reactive gasifier element;
    c. providing a source of plasma excitation energy;
    d. exciting said source of plasma excitation energy to excite the feedstock gases to form in a volume in which magnetic field can not create an electron cyclotron resonance condition, a plasma therein of excited precursor species, wherein said preferentially bonding scavenger element bonds with said reactive gasifier element to form a chemical compound that is carried off as an effluent in the process at rates sufficient to remove reactive gasifier elements from the plasma whereby to provide net film deposition; and
    e. positioning at least a portion of said plasma of excited precursor species adjacent a surface of said substrate, while said substrate is below 380 degrees centigrade, to form thereon from said excited precursor species an alloy film of controlled hydrogen content which includes elements derived from said precursor species.

2. The method of claim 1 wherein the reactive gasifier element is fluorine.

3. The method of claim 2 wherein the fluoride is a perfluorosilane.

4. The method of claim 3 wherein the perfluorosilane is chosen from the group consisting of tetrafluorosilane and hexafluorodisilane 5. The method of claim 3 wherein the feedstock gas further includes an oxygen source to provide a silicon oxide alloy substantially free of hydrogen.

6. The method of claim 5 wherein the oxygen source is chosen from the group consisting of nitrous oxide, carbon monoxide, carbon dioxide, ozone, and oxygen.

7. The method of claim 3 wherein the feedstock gas further includes nitrogen source to provide a silicon nitride alloy substantially free of hydrogen.

8. The method of claim 7 wherein the nitrogen source is chosen from the group consisting of nitrogen, covalent nitrides, nitrogen oxides, and binary nitrogen halides.

9. The method of claim 3 wherein the feedstock gas further includes a carbon source to provide a silicon carbide alloy substantially free of hydrogen.

10. The method of claim 1 wherein the preferentially bonding scavenger element for the highly reactive gasifier element is nitrogen.

11. The method of claim 10 wherein the compound of the reactive gasifier element is $BF_3$, the feedstock gas further includes a carbon compound, and the multiple element alloy comprises boron and carbon.

12. The method of claim 1 wherein the source of plasma excitation energy is a microwave source 13. A method of depositing on a substrate a multiple element alloy of controlled hydrogen content comprising the steps of:
    a. establishing a vacuum deposition region and positioning a substrate therein;
    b. providing a plurality of feedstock gases, substantially free of chemically bonded hydrogen, at least one of said feedstock gases containing an element or elements which are components of the multiple element alloy in chemically bonded form with a reactive gasifier element, and at least another one of said feedstock gases being a multielement compound containing at least one scavenger element capable of preferentially bonding with and scavenging said reactive gasifier element;
    c. providing a source of plasma excitation energy;
    d. exciting said source of plasma excitation energy to excite the feedstock gas compounds to form in a volume in which magnetic fields present can not create an electron cyclotron reasonance condition, a plasma therein of excited precursor species, wherein said preferentially bonding scavenger element bonds with said reactive gasifier element to form a chemical compound that is carrlied off as an effluent in the process at rates sufficient to remove reactive gasifier elements from the plasma whereby to provide net film deposition; and
    e. positioning at least a portion of said plasma of excited precursor species adjacent a surface of said substrate to form thereon from said excited precursor species an alloy film of controlled hydrogen content which includes elements derived from said precursor species.

14. The method of claim 13 wherein the highly reactive gasifier element is fluorine.

15. The method of claim 14 wherein the source of plasma excitation energy is a microwave source 16. The method of claim 15 wherein the fluoride is a perfluorosilane.

17. The method of claim 16 wherein the perfluorosilane is chosen from the group consisting of tetrafluorosilane and hexafluorodisilane.

18. The method of claim 16 wherein the feedstock gas further includes an oxygen source to provide a silicon oxide alloy substantially free of hydrogen.

19. The method of claim 18 wherein the oxygen source is chosen from the group consisting of nitrous oxide, carbon monoxide, carbon dioxide, ozone, and oxygen.

20. The method of claim 16 wherein the feedstock gas further includes nitrogen source to provide a silicon nitride alloy substantially free of hydrogen.

21. The method of claim 20 wherein the nitrogen source is chosen from the group consisting of nitrogen, covalent nitrides, nitrogen oxides, and binary nitrogen halides.

22. The method of claim 16 wherein the feedstock gas further includes a carbon source to provide a silicon carbide alloy substantially free of hydrogen.

23. The method of claim 14 wherein the highly reactive gasifier element is fluorine and the scavenger element for the highly reactive compound in nitrogen.

24. The method of claim 23 wherein the compound of the highly reactive element is $BF_3$, the feedstock gas further includes a carbon compound, and the multiple element alloy comprises boron and carbon.

25. A method of depositing on a substrate a multiple element alloy of controlled hydrogen content comprising the steps of:
  a. establishing a vacuum deposition regions and positioning a substrate therein;
  b. providing a plurality of feedstock gases, substantially free of chemically bonded hydrogen, at least one of said feedstock gases containing an element or elements which are components of the multiple element alloy in chemically bonded form with a reactive gasifier element and at least another one of said feedstock gases containing at least one scavenger element capable of preferentially bonding with and scavenging said reactive gasifier element and being present in the feedstock gas in substantial stoichiometric excess to scavenge said reactive gasifier element;
  c. providing a source of plasma excitation energy;
  d. exciting said source of plasma excitation energy to excite the feedstock gas compounds to form in a volume in which magnetic field present can not create an electron resonance condition a plasma therein of excited precursor species, wherein said preferentially bonding element bonds with said reactive element to form a chemical compound that is carried off as an effluent in the process at rates sufficient to remove reactive gasifer element from the plasma whereby to provide net film deposition; and
  e. positioning at least a portion of said plasma of excited precursor species adjacent a surface of said substrate to form thereon from said excited precursor species an alloy film of controlled hydrogen content which includes elements derived from said precursor species.

26. The method of claim 25 wherein the reactive gasifier element is fluorine.

27. The method of claim 26 wherein the source of plasma excitation energy is a microwave source.

28. The method of claim 26 wherein the fluoride is a perfluorosilane.

29. The method of claim 25 wherein the perfluorosilane is chosen from the group consisting of tetrafluorosilane and hexafluorodisilane.

30. The method of claim 28 wherein the feedstock gas further includes an oxygen source to provide a silicon oxide alloy substantially free of hydrogen.

31. The method of claim 30 wherein the oxygen source is chosen from the group consisting of nitrous oxide, carbon monoxide, carbon dioxide, ozone, and oxygen.

32. The method of claim 28 wherein the feedstock gas further includes nitrogen source to provide a silicon nitride alloy substantially free of hydrogen.

33. The method of claim 32 wherein the nitrogen source is chosen from the group consisting of nitrogen, covalent nitrides, nitrogen oxides, and binary nitrogen halides.

34. The method of claim 28 wherein the feedstock gas further includes a carbon source to provide a silicon carbide alloy substantially free of hydrogen.

35. The method of claim 26 wherein the reactive gasifier element is fluorine; and the scavenger element for the reactive gasifier element is nitrogen.

36. The method of claim 35 wherein the compound of the highly reactive element is $BF_3$, the feedstock gas further includes a carbon compound, and the multiple element alloy comprises boron and carbon.

37. A method of depositing on a substrate a multiple element alloy of controlled hydrogen content comprising the steps of:
  a. establishing a vacuum deposition region and positioning a substrate therein;
  b. providing a plurality of feedstock gases, substantially free of chemically bonded hydrogen, at least one of said feedstock gases containing an element or elements which are components of the multiple element alloy in chemically bonded form with a reactive gasifier element, and at least another one of said feedstock gases being a multielement compound containing at least one scavenger element capable of preferentially bonding with and being present in the feedstock gas in substantial excess to scavenge said reactive gasifier element;
  c. providing a source of plasma excitation energy;
  d. exciting said source of plasma excitation energy to excite the feedstock gas compounds to form in a volume in which magnetic fields can not create an electron cyclotron condition a plasma therein of excited precursor species, wherein said preferentially bonding scavenger element bonds with said reactive gasifier element to form a chemical compound that is carried off as an effluent in the process at rates sufficient to remove reactive gassifier elements from the plasma whereby to provide net film deposition; and
  e. positioning at least a portion of said plasma of excited precursor species adjacent a surface of said substrate to form thereon from said excited precursor species an alloy film of controlled hydrogen content which includes elements derived from said precursor species.

38. The method of claim 37 wherein the reactive gasifier element is fluorine.

39. The method of claim 37 wherein the source of plasma excitation energy is a microwave source.

40. The method of claim 39 wherein the fluorine is a perfluorosilane.

41. The method of claim 40 wherein the perfluorosilane is chosen from the group consisting of tetrafluorosilane and hexafluorodisilane.

42. The method of claim 40 wherein the feedstock gas further includes an oxygen source to provide a silicon oxide alloy substantially free of hydrogen.

43. The method of claim 42 wherein the oxygen source is chosen from the group consisting of nitrous oxide, carbon monoxide, carbon dioxide, ozone, and oxygen.

44. The method of claim 40 wherein the feedstock gas further includes nitrogen source to provide a silicon nitride alloy substantially free of hydrogen.

45. The method of claim 44 wherein the nitrogen source is chosen from the group consisting of nitrogen, covalent nitrides, nitrogen oxides, and binary nitrogen halides.

46. The method of claim 40 wherein the feedstock gas further includes a carbon source to provide a silicon carbide allo substantially free of hydrogen.

47. The method of claim 37 wherein the reactive gasifier element is fluorine; and the scavenger for the highly reactive compound in nitrogen.

48. The method of claim 47 wherein the compound of the highly reactive element is $BF_3$, the feedstock gas further includes a carbon compound, and the multiple element alloy comprises boron and carbon.

49. A method of depositing on a thermally degradable substrate chosen from the group consisting of organic polymeric substrates a multiple element silicon alloy of controlled hydrogen content comprising the steps of:
  a. establishing a vacuum deposition region and positioning the thermally degradable substrate therein;
  b. providing a plurality of feedstock gases, substantially free of chemically bonded hydrogen, one of said feedstock gases containing perfluorosilane, and another one of said feedstock gases containing a stoichiometric excess of nitrogen capable of preferentially bonding with and scavenging the fluorine, said feedstock gas containing an element capable of reacting with the silicon to form the silicon alloy;
  c. providing a microwave source of plasma excitation energy;
  d. exciting said microwave source of plasma excitation energy to excite the feedstock gas compounds to form a plasma therein of excited precursor species in the substantial absence of a magnetic field, wherein said nitrogen bonds with said fluorine to form a chemical compound that is carried off as an effluent in the process; and
  e. positioning a least a portion of said plasma of excited precursor species adjacent a surface of said thermally degradable substrate to form thereon from said excited precursor species an alloy film of controlled hydrogen content which includes elements derived from said precursor species.

50. The method of claim 49 wherein the perfluorosilane is chosen from the group consisting of tetrafluorosilane and hexafluorodisilane.

51. The method of claim 49 wherein the feedstock gas further includes an oxygen source to provide a silicon oxide alloy substantially free of hydrogen.

52. The method of claim 51 wherein the oxygen source is chosen from the group consisting of nitrous oxide, carbon monoxide, carbon dioxide, ozone, and oxygen.

53. The method of claim 49 wherein the feedstock gas further includes a nitrogen source to provide a silicon nitride alloy substantially free of hydrogen.

54. The method of claim 51 wherein the nitrogen source is chosen from the group consisting of nitrogen, covalent nitrides, nitrogen oxides, and binary nitrogen halides.

55. The method of claim 54 wherein the feedstock gas further includes a carbon source to provide a silicon carbide alloy substantially free of hydrogen.

56. A method of depositing on a substrate a boron-carbon alloy of controlled hydrogen content comprising the steps of:
  a. establishing a vacuum deposition region and positioning a substrate therein;
  b. providing a plurality of feedstock gases, each containing at least one of the elements to be deposited and each being substantially free of chemically bonded hydrogen, one of said feedstock gases containing in chemically bonded form boron and fluorine, at least one of said feedstock gases containing carbon, and at least one of said feedstock gases containing nitrogen;
  c. providing a source of plasma excitation energy;
  d. exciting said source of plasma excitation energy to excite the feedstock gases to form a plasma therein of excited precursor species, wherein said nitrogen bonds with said fluorine to form $NF_3$ that is capable of being carried off as an effluent in the process; and
  e. positioning at least a portion of said plasma of excited precursor species adjacent a surface of said substrate to form thereon from said excited precursor species a boron-carbon alloy film of controlled hydrogen content.

57. A method of depositing a substantially hydrogen free silicon oxide alloy film on an organic polymeric substrate, comprising the steps of:
  a. providing a substrate in a vacuum deposition chamber;
  b. providing a source of microwave energy;
  c. coupling the source of microwave energy to the vacuum deposition chamber;
  d. introducing a substantially hydrogen free feedstock gas composition comprising tetrafluorosilane and $NO_2$ into the reaction chamber at a pressure corresponding substantially to a pressure minimum of a modified Paschen curve for tetrafluorosilane-$NO_2$ reaction gas precursor composition; and
  e. activating the source of microwave energy and forming a plasma in the vacuum deposition chamber to deposit a substantially hydrogen free, hard, transparent silicon oxide alloy film on the organic polymeric substrate.

58. A method of forming a shaped article having a multiple element alloy coating on a flexible substrate, comprising the steps of:
  a. establishing vacuum deposition region and positioning the flexible substrate therein;
  b. providing a plurality of feedstock gases, substantially free of chemically bonded hydrogen, at least one of said feedstock gases containing an element or elements which are components of the multiple element alloy in chemically bonded form with a reactive gasifier element and at least another one of said feedstock gases containing at least one scavenger element capable of preferentially bonding with and scavenging said reactive gasifier element and being present in the feedstock gas in substantial excess to scavenge said reactive gasifier element;
  c. providing a microwave source of plasma energy;
  d. exciting said microwave source of plasma excitation energy and to form a plasma therein of excited precursor species in which magnetic fields present cannot create an electron cyclotron resonance condition, wherein said preferentially bonding scavenger element bonds with said reactive gasifier element to form a chemical compound that is carried off as an effluent in the process at rates sufficient to remove reactive gasifier element from the plasma whereby to provide net film deposition;
  e. positioning at least a portion of said plasma of excited precursor species adjacent a surface of said flexible substrate to form thereon from said excited precursor species an alloy film of controlled hydrogen content which includes elements derived from said precursor species; and
  f. shaping said flexible substrate.

59. The method of claim 58 comprising first depositing a carbonaceous underlayer on said flexible substrate, and thereafter depositing the multiple element alloy atop the carbonaceous underlayer.

60. The method of claim 59 wherein the carbonaceous underlayer has a thickness of from 0.5 to 2.0 microns.

61. The method of claim 58 comprising first depositing an underlayer of relatively high hydrogen content, multiple element alloy on the flexible substrate, and thereafter depositing multiple element alloy of lower hydrogen content atop the underlayer.

62. The method of claim 61 wherein the underlayer has a thickness of from 0.5 to 2.0 microns.

63. The method of claim 58 wherein the feedstock gas composition comprises a perhalosilane.

64. The method of claim 63 wherein the perhalosilane is a perfluorosilane.

65. The method of claim 64 wherein the perfluorosilane is chosen from the group consisting of tetrafluorosilane and hexafluorodisilane.

66. The method of claim 65 wherein the reaction precursor gas further includes an oxygen source to provide a silicon oxide alloy substantially free of hydrogen.

67. The method of claim 66 wherein the oxygen source is chosen from the group consisting of nitrous oxide, carbon monoxide, carbon dioxide, ozone, and oxygen.

68. The method of claim 65 wherein the reaction precursor gas further includes nitrogen source to provide a silicon nitride alloy substantially free of hydrogen.

69. The method of claim 68 wherein the nitrogen source is chosen from the group consisting of nitrogen, covalent nitrides, nitrogen oxides, and binary nitrogen halides.

70. The method of claim 67 wherein the reaction precursor gas further includes a carbon source to provide a silicon carbide alloy substantially free of hydrogen.

71. The method of claim 58 wherein the reactive gasifier element is fluorine; and the scavenger element for the highly reactive compound is nitrogen.

72. The method of claim 71 wherein the compound of the reactive gasifier element is $Bf_3$, the feedstock gas further includes a carbon compound, and the multiple element alloy comprises boron and carbon.

73. A method of depositing on an environmentally degradable organic polymeric substrate a multiple layer coating comprising a plurality of multiple element silicon alloy layers of controlled hydrogen content comprising the steps of:
   a. establishing a vacuum deposition region and positioning the environmentally degradable substrate therein;
   b. providing a plurality of feedstock gases, each being substantially free of chemically bonded hydrogen, a first one of said feedstock gases containing perfluorosilane, and a sequence of second feedstock gases containing a stoichiometric excess of nitrogen capable of preferentially bonding with and scavenging the fluorine, one of said second feedstock gas containing nitrogen capable of reacting with the silicon to form a silicon-nitrogen alloy and one of said second feedstock gases containing nitrogen and oxygen to form a silicon-oxygen alloy;
   c. feeding said second nitrogen containing feedstock gases in sequence to form layers of silicon-nitrogen alloy and of silicon-oxygen alloy;
   d. providing a microwave source of plasma excitation energy;
   e. forming a plasma therein of excited precursor species in the substantial absence of a magnetic field, wherein said nitrogen bonds with said fluorine to form a chemical compound that is carried off as an effluent in the process; and
   f. positioning a least a portion of said plasma of excited precursor species adjacent a surface of said thermally degradable substrate to form thereon from said excited precursor species an alloy film of controlled hydrogen content which includes elements derived from said precursor species.

74. The method of claim 73 wherein the perfluorosilane is chosen from the group consisting of tetrafluorosilane and hexafluorodisilane.

75. The method of claim 73 wherein the oxygen and nitrogen containing gas is chosen from the group consisting of $NO_2$, $NO$, $N_2O_3$, $N_2O$, and mixtures thereof.

76. The method of claim 73 wherein the gas including nitrogen to provide a silicon nitride alloy substantially free of hydrogen is chosen from the group consisting of $N_2$ and $[CN]_2$.

77. The method of claim 73 comprising depositing a photochromic layer between silicon nitride 78. A method of controlling the stoichiometry and properties of a plasma deposited multi-element alloy film on a substrate comprising:
   (a) forming a multi-element feedstock gas mixture, each of the elements thereof provides one or more of the following functions:
      (1) gasifying an element which will eventually comprise a component of the multi-element film on the substrate;
      (2) comprise a component of the multi-element film on the substrate; or
      (3) scavenging one or more of the gasifying elements;
   (b) controlling the ratio of the gasifying elements to the scavenging elements;
   (c) providing a plasma exciting energy high enough to decompose the gas component and deposit the film; and
   (d) controlling the relative amounts of the gasifying elements and the scavenging elements in the feedstock gas mixtures.

so as to control the stoichiometry of the deposited film invariant of substrate temperatures and magnetic fields and deposit a multi-element alloy film.

* * * * *